(12) United States Patent
Lee et al.

(10) Patent No.: US 12,538,623 B2
(45) Date of Patent: Jan. 27, 2026

(54) LIGHT EMITTING ELEMENT AND DISPLAY DEVICE INCLUDING A PLURALITY OF LIGHT EMITTING LAYERS

(71) Applicant: LG Display Co., Ltd., Seoul (KR)

(72) Inventors: KooHwa Lee, Daegu (KR); WooNam Jeong, Paju-si (KR); HyeonHo Son, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 113 days.

(21) Appl. No.: 17/506,432

(22) Filed: Oct. 20, 2021

(65) Prior Publication Data
US 2022/0181381 A1 Jun. 9, 2022

(30) Foreign Application Priority Data
Dec. 4, 2020 (KR) .......................... 10-2020-0168658

(51) Int. Cl.
*H10H 29/10* (2025.01)
*H01L 25/18* (2023.01)

(52) U.S. Cl.
CPC .............. *H10H 29/10* (2025.01); *H01L 25/18* (2013.01)

(58) Field of Classification Search
CPC ..... H01L 27/15; H01L 25/18; H01L 25/0753; H01L 25/167; H01L 33/40; H01L 27/153;
(Continued)

(56) References Cited

U.S. PATENT DOCUMENTS 6,100,103 A * 8/2000 Shim ....................... H01L 27/15
  438/455
2004/0188791 A1* 9/2004 Horng ..................... H01L 33/42
  257/434
(Continued)

FOREIGN PATENT DOCUMENTS

CN 101517757 A 8/2009
CN 110957347 A 4/2020
(Continued)

OTHER PUBLICATIONS

E. Xie et al., "Design, Fabrication, and Application of GaN-Based Micro-LED Arrays With Individual Addressing by N-Electrodes," in IEEE Photonics Journal, vol. 9, No. 6, pp. 1-11, Dec. 2017, Art No. 7907811, doi: 10.1109/JPHOT.2017.2768478. (Year: 2017).*

*Primary Examiner* — Davienne N Monbleau
*Assistant Examiner* — John Patrick Cornely
(74) *Attorney, Agent, or Firm* — Birch, Stewart, Kolasch & Birch, LLP

(57) ABSTRACT

A light emitting element and a display device are discussed. The light emitting element can include a first n-type semiconductor layer, a first light emitting layer disposed on the first n-type semiconductor layer, a first p-type semiconductor layer disposed on the first light emitting layer, a second p-type semiconductor layer disposed on the first p-type semiconductor layer, a bonding layer disposed between the first p-type semiconductor layer and the second p-type semiconductor layer, a second light emitting layer disposed on the second p-type semiconductor layer, a second n-type semiconductor layer disposed on the second light emitting layer, a p-type electrode disposed on the second p-type semiconductor layer, a first n-type electrode disposed on the first n-type semiconductor layer, and a second n-type electrode disposed on the second n-type semiconductor layer.

9 Claims, 23 Drawing Sheets

(58) Field of Classification Search
CPC ... H01L 33/08; H01L 27/156; H01L 27/1214; H01L 33/38
See application file for complete search history.

(56) References Cited

U.S. PATENT DOCUMENTS

| | | | | |
|---|---|---|---|---|
| 2006/0273324 | A1* | 12/2006 | Asai | H01L 33/32 |
| | | | | 438/30 |
| 2017/0018679 | A1* | 1/2017 | Lee | H01L 33/08 |
| 2020/0066954 | A1* | 2/2020 | Kuo | H01L 33/42 |
| 2020/0402964 | A1* | 12/2020 | Kim | H01L 25/0756 |
| 2023/0013968 | A1* | 1/2023 | Wang | H10K 50/115 |
| 2023/0378412 | A1* | 11/2023 | Jang | H01L 33/0016 |

FOREIGN PATENT DOCUMENTS

| | | |
|---|---|---|
| KR | 10-2011-0132160 A | 12/2011 |
| KR | 10-2013-0064156 A | 6/2013 |
| KR | 10-2170243 B1 | 10/2020 |

\* cited by examiner

LIGHT EMITTING ELEMENT AND DISPLAY DEVICE INCLUDING A PLURALITY OF LIGHT EMITTING LAYERS

CROSS-REFERENCE TO RELATED APPLICATIONS

This application claims the priority benefit of Korean Patent Application No. 10-2020-0168658 filed on Dec. 4, 2020, in the Korean Intellectual Property Office, the entire contents of which are hereby expressly incorporated herein by reference into the present application.

BACKGROUND OF THE DISCLOSURE

Technical Field

The present disclosure relates to a light emitting element and a display device, and more particularly, to a light emitting element which emits a plurality of light and a display device including the light emitting element.

Discussion of the Background Art

As display devices which are used for a monitor of a computer, a television, or a cellular phone, there are an organic light emitting display device (OLED) which is a self-emitting device and a liquid crystal display device (LCD) which uses a separate light source.

An applicable range of the display device is diversified to personal digital assistants as well as monitors of computers and televisions, and a display device with a large display area and a reduced volume and weight is being studied.

In recent years, a display device including an LED (light emitting diode or element) is attracting attention as the next generation display device. Since the LED is formed of an inorganic material, rather than an organic material, reliability of the display device is excellent so that a lifespan of the display device can be longer than the liquid crystal display device or the organic light emitting display device.

Further, the LED has a fast lighting speed, excellent luminous efficiency, and a strong impact resistance so that a stability is excellent and an image having a high luminance can be displayed.

SUMMARY OF THE DISCLOSURE

An object to be achieved by the present disclosure is to provide a light emitting element which emits one or more color lights and a display device applied with the same.

Objects of the present disclosure are not limited to the above-mentioned objects, and other objects, which are not mentioned above, can be clearly understood by those skilled in the art from the following descriptions.

According to an aspect of the present disclosure, a light emitting element includes a first n-type semiconductor layer, a first light emitting layer disposed on the first n-type semiconductor layer, a first p-type semiconductor layer disposed on the first light emitting layer, a second p-type semiconductor layer disposed on the first p-type semiconductor layer, a bonding layer disposed between the first p-type semiconductor layer and the second p-type semiconductor layer, a second light emitting layer disposed on the second p-type semiconductor layer, a second n-type semiconductor layer disposed on the second light emitting layer, a p-type electrode disposed on the second p-type semiconductor layer, a first n-type electrode disposed on the first n-type semiconductor layer, and a second n-type electrode disposed on the second n-type semiconductor layer. Therefore, a light emitting element includes a first light emitting layer and a second light emitting layer which emit different color lights among one or more color lights.

According to another aspect of the present disclosure, a display device includes a substrate having a display area in which a plurality of pixels is disposed and a non-display area in the vicinity of the display area, and a first light emitting element and a second light emitting element disposed in each of the plurality of pixels. At this time, each of the first and second light emitting elements includes a first n-type semiconductor layer disposed on the substrate, a first light emitting layer disposed on the first n-type semiconductor layer, a p-type semiconductor layer disposed on the first light emitting layer, a second light emitting layer disposed on the p-type semiconductor layer, a second n-type semiconductor layer disposed on the second light emitting layer, a p-type electrode disposed on the p-type semiconductor layer, a first n-type electrode disposed on the first n-type semiconductor layer, and a second n-type electrode disposed on the second n-type semiconductor layer.

Other detailed matters of the exemplary embodiments are included in the detailed description and the drawings.

According to the exemplary embodiments of the present disclosure, the light emitting element can emit red light and green light together or emit red light and blue light together.

According to the exemplary embodiments of the present disclosure, the display device can configure a pixel with the reduced number of light emitting elements as compared with the display device with the structure of a related art. Therefore, in the display device of the present disclosure, a space utilization can be increased and the aperture rate can be significantly improved when it is applied to a transparent display device.

Further, the display device according to the exemplary embodiments of the present disclosure can further improve a contrast. Moreover, the display device can reduce a production cost as compared with a display device with the structure of the related art.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
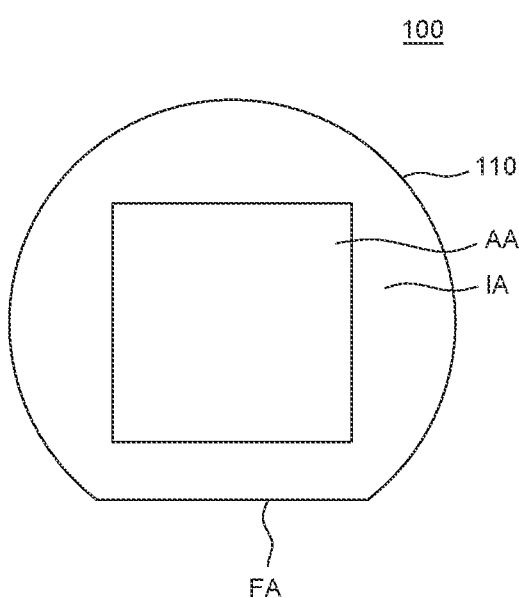
FIG. 1 is a plan view of a wafer according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to the drawings. All the components of each light emitting element and each display device using such light emitting elements are operatively coupled and configured.

Figure 2:
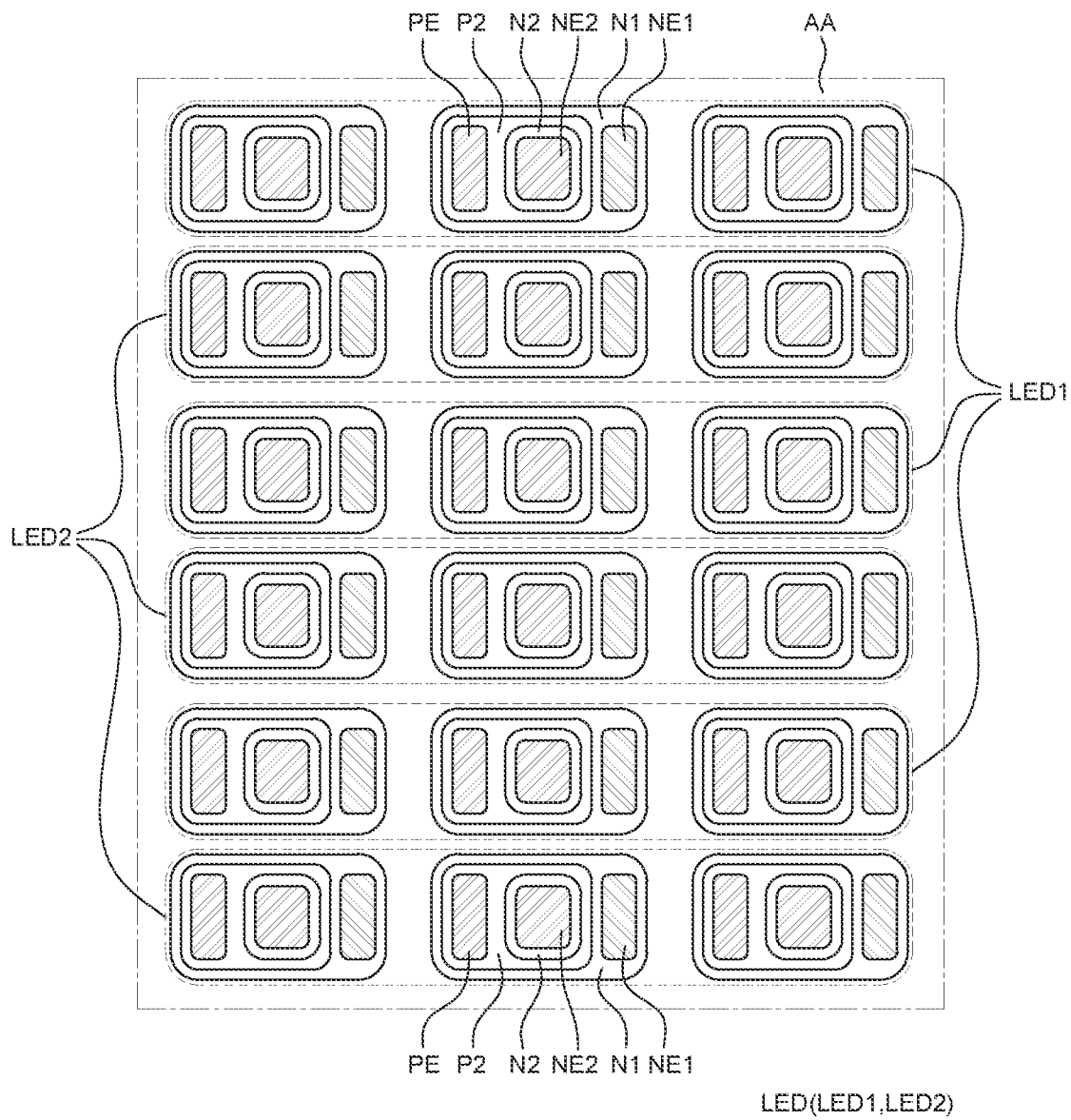
FIG. 2 is an enlarged plan view of the wafer according to the embodiment of the present disclosure.

FIG. 1 is a plan view of a wafer according to an exemplary embodiment of the present disclosure. FIG. 2 is an enlarged plan view of the wafer according to the embodiment of the present disclosure.

Referring to FIGS. 1 and 2, a wafer 100 according to an exemplary embodiment of the present disclosure includes a substrate 110 and a plurality of light emitting elements LED.

The substrate 110 is a configuration for supporting various components included in the wafer 100. The plurality of light emitting elements LED is grown on the substrate 110 and the substrate 110 can be formed of various materials depending on a material which configures the plurality of light emitting elements LED. For example, the substrate 110 can be formed of sapphire, gallium nitride (GaN), silicon (Si), silicon carbide (SiC), or the like, but is not limited thereto.

Referring to FIG. 1, the substrate 110 includes an active area AA and an outer peripheral area IA. In the active area AA, the plurality of light emitting elements LED is formed and in the outer peripheral area IA which can enclose the entire active area AA (or part thereof), an alignment key, etc. is disposed.

A flat area FA is disposed in a part of an edge of the substrate 110. The flat area FA is a part of the edge of the substrate 110 having a circular shape which is formed to be linear. The flat area FA is provided to distinguish a structure of the wafer 100 so that the flat area FA is used to determine whether the wafer 100 is vertical or horizontal and is also used as a reference line when the wafer 100 is processed.

Referring to FIG. 2, the plurality of light emitting elements LED is disposed in the active area AA. The plurality of light emitting elements LED is semiconductor elements which emit light at the time of applying a voltage. The light emitting element LED can emit red light, green light, blue light, and the like and implement various color light including white by combination of the light.

The plurality of light emitting elements LED can be formed by growing a crystal layer by forming a material such as gallium nitride (GaN) which configures the plurality of light emitting elements LED on the substrate 110, cutting the crystal layer into individual chips and forming electrodes. A detailed description for a forming process of the plurality of light emitting elements LED will be described below with reference to FIGS. 4A to 4G.

The plurality of light emitting elements LED includes a first light emitting element LED1 and a second light emitting element LED2. The first light emitting element LED1 is a light emitting element which emits red light and green light and the second light emitting element LED2 is a light emitting element which emits red light and blue light.

The first light emitting element LED1 and the second light emitting element LED2 can be disposed on the substrate 110 with a predetermined interval to correspond to a position to be transferred onto the display device. Specifically, various color light can be displayed by the combination of red light, green light, and blue light emitted from the first light emitting element LED1 and the second light emitting element LED2. Therefore, the first light emitting element LED1 which emits red light and green light and the second light emitting element LED2 which emits red light and blue light are disposed in the display device to be adjacent to each other to form one pixel.

Accordingly, when the first light emitting element LED1 and the second light emitting element LED2 are disposed on the substrate 110 to be adjacent to each other to correspond to a position of one pixel, the first light emitting element LED1 and the second light emitting element LED2 are not individually transferred, but can be simultaneously transferred. Therefore, the transferring process can be simplified.

Accordingly, the first light emitting element LED1 and the second light emitting element LED2 are disposed in the same row or the same column to be adjacent to each other and one first light emitting element LED1 and one second light emitting element LED2 which are adjacent to each other can correspond to one pixel. For example, the plurality of first light emitting elements LED1 is disposed in odd-numbered rows among the plurality of rows and the plurality of second light emitting elements LED2 is disposed in even-numbered rows among the plurality of rows. The first light emitting element LED1 and the second light emitting element LED2 can be alternately disposed in a column direction. However, the plurality of light emitting elements LED can be disposed in various shapes depending on the placement of the plurality of pixels of the display device, but is not limited as illustrated in the drawing.

Hereinafter, the plurality of light emitting elements LED will be described in detail with reference to FIGS. 3A to 3D.

Figure 3A:
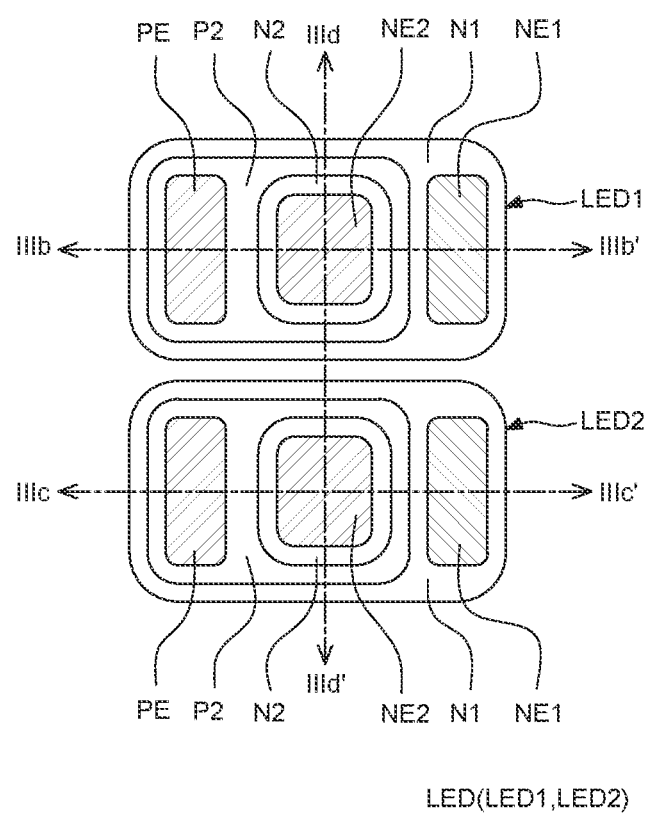
FIG. 3A is a plan view of a plurality of light emitting elements according to an exemplary embodiment of the present disclosure.
Figure 3B:
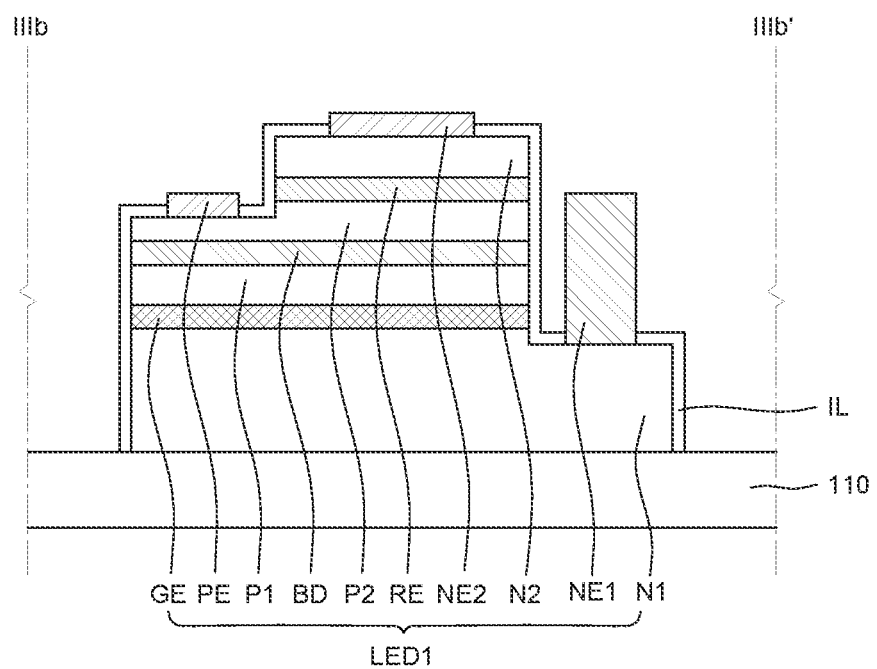
FIG. 3B is a cross-sectional view taken along line IIIb-IIIb' of FIG. 3A.
Figure 3C:
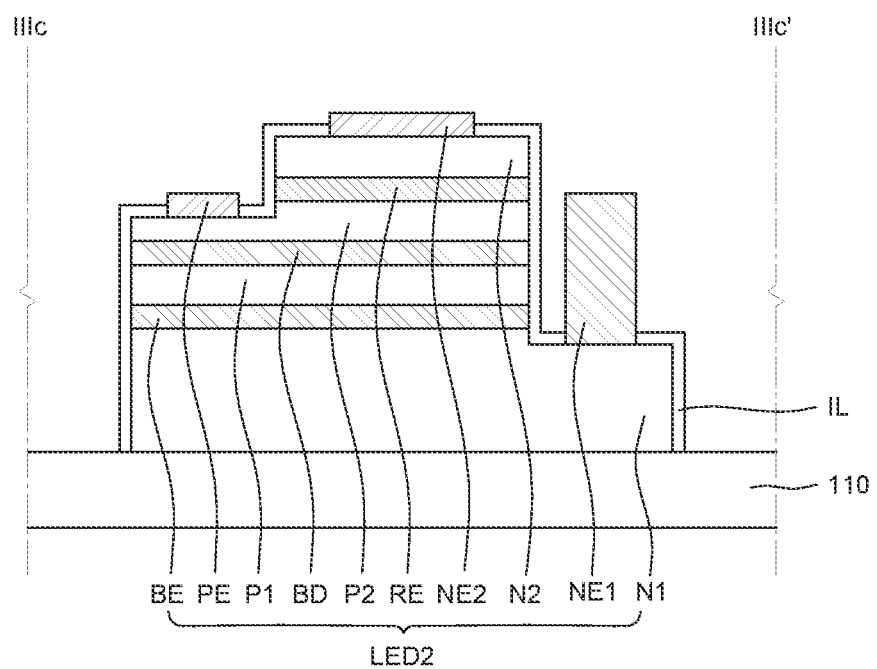
FIG. 3C is a cross-sectional view taken along line IIIc-IIIc' of FIG. 3A.
Figure 3D:
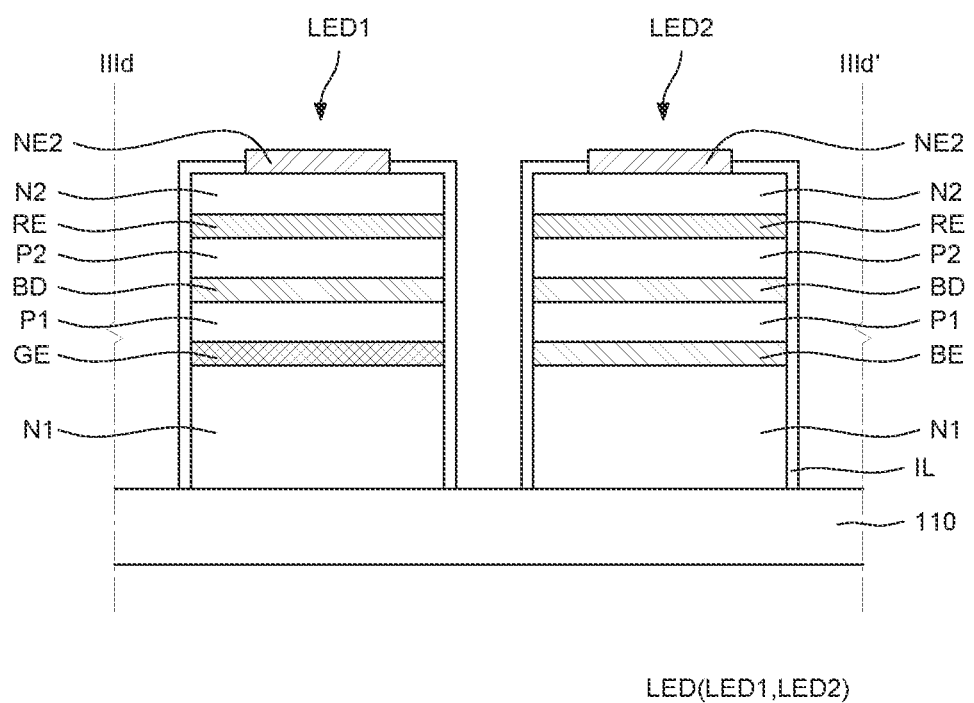
FIG. 3D is a cross-sectional view taken along line IIId-IIId' of FIG. 3A.

FIG. 3A is a plan view of a plurality of light emitting elements according to an exemplary embodiment of the present disclosure. FIG. 3B is a cross-sectional view taken along line IIIb-IIIb' of FIG. 3A. FIG. 3C is a cross-sectional view taken along line IIIc-IIIc' of FIG. 3A. FIG. 3D is a cross-sectional view taken along line IIId-IIId' of FIG. 3A.

Referring to FIGS. 3A, 3B, and 3D together, among the plurality of light emitting elements LED, the first light emitting element LED1 includes a first n-type semiconductor layer N1, a first green light emitting layer GE, a first p-type semiconductor layer P1, a bonding layer BD, a second p-type semiconductor layer P2, a second light emitting layer RE, a second n-type semiconductor layer N2, a first n-type electrode NE1, a second n-type electrode NE2, and a p-type electrode PE.

The first n-type semiconductor layer N1 is disposed on the substrate 110 and the first p-type semiconductor layer P1 is disposed on the first n-type semiconductor layer N1. The first n-type semiconductor layer N1 and the first p-type semiconductor layer P1 can be formed by doping n-type and p-type impurities into a specific material. The first n-type semiconductor layer N1 can be a layer formed by doping n-type impurities into a material such as gallium nitride (GaN) and the first p-type semiconductor layer P1 can be a layer formed by doping p-type impurities into a material such as gallium nitride (GaN). For example, the n-type impurity can be silicon (Si), germanium (Ge), tin (Sn), and the like and the p-type impurity can be magnesium (Mg), zinc (Zn), beryllium (Be), and the like, but are not limited thereto.

The first green light emitting layer GE is disposed between the first n-type semiconductor layer N1 and the first p-type semiconductor layer P1. The first green light emitting layer GE is supplied with holes and electrons from the first n-type semiconductor layer N1 and the first p-type semiconductor layer P1 to emit light. For example, the first green light emitting layer GE can emit green light by holes and electrons supplied from the first n-type semiconductor layer N1 and the first p-type semiconductor layer P1. The first green light emitting layer GE can be formed by a single layer or a multi-quantum well (MQW) structure, and for example, can be formed of indium gallium nitride (InGaN), gallium nitride (GaN), or the like, but is not limited thereto.

The second p-type semiconductor layer P2 is disposed on the first p-type semiconductor layer P1 and the second n-type semiconductor layer N2 is disposed on the second p-type semiconductor layer P2. The second n-type semiconductor layer N2 and the second p-type semiconductor layer P2 can be formed by doping n-type and p-type impurities into a specific material. The second n-type semiconductor layer N2 can be a layer formed by doping n-type impurities into a material such as aluminum indium phosphide (AlInP) or gallium arsenide (GaAs). The second p-type semiconductor layer P2 can be a layer formed by doping p-type impurities into a material such as gallium phosphate (GaP). For example, the n-type impurity can be silicon (Si), germanium (Ge), tin (Sn), and the like, and the p-type impurity can be magnesium (Mg), zinc (Zn), beryllium (Be), and the like, but are not limited thereto.

The second light emitting layer RE is disposed between the second p-type semiconductor layer P2 and the second n-type semiconductor layer N2. The second light emitting layer RE is supplied with holes and electrons from the second n-type semiconductor layer N2 and the second p-type semiconductor layer P2 to emit light. For example, the second light emitting layer RE can emit red light by holes and electrons supplied from the second n-type semiconductor layer N2 and the second p-type semiconductor layer P2. The second light emitting layer RE can be formed by a single layer or a multi-quantum well (MQW) structure, and for example, can be formed of aluminum gallium indium phosphide (AlGaInP), and the like, but is not limited thereto.

A part of the first n-type semiconductor layer N1 protrudes to the outside of (e.g., extends beyond an outer edge of) the first green light emitting layer GE, the first p-type semiconductor layer P1, the second p-type semiconductor layer P2, the second light emitting layer RE, and the second n-type semiconductor layer N2. The first green light emitting layer GE, the first p-type semiconductor layer P1, the second p-type semiconductor layer P2, the second light emitting layer RE, and the second n-type semiconductor layer N2 have sizes smaller than the size of the first n-type semiconductor layer N1. By doing this, a top surface of the first n-type semiconductor layer N1 is exposed. The first n-type semiconductor layer N1 can be partially exposed from the first green light emitting layer GE, the first p-type semiconductor layer P1, the second p-type semiconductor layer P2, the second light emitting layer RE, and the second n-type semiconductor layer N2 to be electrically connected to the first n-type electrode NE1. In this case, the entire first green light emitting layer GE, the entire first p-type semiconductor layer P1, the entire second p-type semiconductor layer P2, the entire second light emitting layer RE, and the entire second n-type semiconductor layer N2 can overlap a part of the first n-type semiconductor layer N1.

A part of the second p-type semiconductor layer P2 protrudes outwardly from the second light emitting layer RE and the second n-type semiconductor layer N2. The second light emitting layer RE and the second n-type semiconductor layer N2 can have sizes smaller than the second p-type semiconductor layer P2 so as to expose a top surface of the second p-type semiconductor layer P2. The second p-type semiconductor layer P2 can be partially exposed from the second light emitting layer RE and the second n-type semiconductor layer N2 to be electrically connected to the p-type electrode PE. The entire second light emitting layer RE and the entire second n-type semiconductor layer N2 can overlap a part of the second p-type semiconductor layer P2, a part of the first p-type semiconductor layer P1, a part of the first green light emitting layer GE, and a part of the first n-type semiconductor layer N1.

The bonding layer BD is disposed between the first p-type semiconductor layer P1 and the second p-type semiconductor layer P2. The bonding layer BD is a member which bonds the first p-type semiconductor layer P1 and the second p-type semiconductor layer P2 and can be formed of a transparent material. The bonding layer BD can be formed of a conductive material having a high transmittance, and for example, can be formed of anisotropic conductive film (ACF) including conductive particles, a metal mesh, or the like. Accordingly, the light emitted from the first green light emitting layer GE passes through the bonding layer BD having a high transmittance to be emitted to an upper portion of the second n-type semiconductor layer N2.

The first n-type electrode NE1 is disposed on the first n-type semiconductor layer N1 and the second n-type electrode NE2 is disposed on the second n-type semiconductor layer N2. The first n-type electrode NE1 is in contact with a top surface of the first n-type semiconductor layer N1 which is exposed from the first green light emitting layer GE to be electrically connected to the first n-type semiconductor layer N1. The second n-type electrode NE2 is in contact with a top surface of the second n-type semiconductor layer N2 to be electrically connected to the second n-type semiconductor layer N2.

The p-type electrode PE is disposed on the second p-type semiconductor layer P2. The p-type electrode PE is in contact with the second p-type semiconductor layer P2 exposed from the second light emitting layer RE to be electrically connected to the second p-type semiconductor layer P2. Further, the p-type electrode PE is also electrically connected to the first p-type semiconductor layer P1.

At this time, the bonding layer BD can be formed of a conductive material. When the bonding layer BD is formed of a conductive material, the p-type electrode PE which is in contact with the second p-type semiconductor layer P2 can also be electrically connected to the first p-type semiconductor layer P1 by means of the bonding layer BD. For example, when the bonding layer BD is formed of a conductive material having a high transmittance, the second p-type semiconductor layer P2 and the first p-type semiconductor layer P1 can be electrically connected to each other by means of the bonding layer BD. Further, the p-type electrode PE which is in contact with the second p-type semiconductor layer P2 can also be electrically connected to the first p-type semiconductor layer P1. Accordingly, the p-type electrode PE is in contact with a top surface of the second p-type semiconductor layer P2 to be electrically connected to both the first p-type semiconductor layer P1 and the second p-type semiconductor layer P2.

In the meantime, a thickness of the first n-type electrode NE1 can be larger than a thickness of the second n-type electrode NE2 and a thickness of the p-type electrode PE. The first n-type electrode NE1 is disposed on a top surface of the first n-type semiconductor layer N1 which is most adjacent to the substrate 110 and the p-type electrode PE is disposed on the top surface of the second p-type semiconductor layer P2 disposed on the first n-type semiconductor layer N1. Further, the second n-type electrode NE2 is disposed on the top surface of the second n-type semiconductor layer N2 which is disposed on the uppermost portion. Therefore, the first n-type electrode NE1 can be disposed to be adjacent to the substrate 110 more than the second n-type electrode NE2 and the p-type electrode PE and a step is caused between the first n-type electrode NE1 and the second n-type electrode NE2 and the p-type electrode PE. When a step is caused between the first n-type electrode NE1 and the second n-type electrode NE2 and the p-type electrode PE, the plurality of light emitting elements LED can be twisted during the process of transferring the plurality of light emitting elements LED. Therefore, the first n-type electrode NE1 is formed to be thicker than the second n-type electrode NE2 and the p-type electrode PE to minimize the step between the first n-type electrode NE1 and the second n-type electrode NE2 and the p-type electrode PE.

In this case, the second n-type electrode NE2 and the p-type electrode PE which overlap the first green light emitting layer GE and the second light emitting layer RE can be formed of a transparent conductive material, such as tin oxide (TO), indium tin oxide (ITO), indium zinc oxide (IZO), or indium zinc tin oxide (ITZO). Further, even though the first n-type electrode NE1 is formed of an opaque conductive material, the first n-type electrode NE1 does not overlap the first green light emitting layer GE and the second light emitting layer RE. Therefore, the first n-type electrode NE1 does not interrupt the traveling of the light emitted from the first green light emitting layer GE and the second light emitting layer RE. Accordingly, the first n-type electrode NE1 can be formed of an opaque conductive material which can be formed to have a large thickness, such as gold (Au).

In the meantime, the first green light emitting layer GE and the second light emitting layer RE independently emit light. For example, when a voltage is applied only to the first n-type electrode NE1 and the p-type electrode PE among the first n-type electrode NE1, the second n-type electrode NE2, and the p-type electrode PE, the first green light emitting layer GE can emit light by means of the first n-type semiconductor layer N1 which is electrically connected to the first n-type electrode NE1 and the first p-type semiconductor layer P1 which is electrically connected to the p-type electrode PE.

Further, the voltage is not applied to the second n-type electrode NE2, so that the second light emitting layer RE does not emit light. For example, when a voltage is applied only to the second n-type electrode NE2 and the p-type electrode PE among the first n-type electrode NE1, the second n-type electrode NE2, and the p-type electrode PE, the second light emitting layer RE can emit light by means of the second n-type semiconductor layer N2 which is electrically connected to the second n-type electrode NE2 and the second p-type semiconductor layer P2 which is electrically connected to the p-type electrode PE. Further, the voltage is not applied to the first n-type electrode NE1, so that the first green light emitting layer GE does not emit light. For example, when the voltage is applied to all the first n-type electrode NE1, the second n-type electrode NE2, and the p-type electrode PE, the first green light emitting layer GE and the second light emitting layer RE can simultaneously emit light. Accordingly, in a state in which a voltage is applied to the p-type electrode PE, a voltage is selectively applied to the first n-type electrode NE1 and the second n-type electrode NE2 to independently control the first green light emitting layer GE and the second light emitting layer RE to emit light.

Next, an insulating layer IL which encloses the first light emitting element LED1 is disposed. The insulating layer IL can be disposed to enclose a part of the first light emitting element LED1 to suppress the electrical short of the first n-type semiconductor layer N1, the first p-type semiconductor layer P1, the second p-type semiconductor layer P2, and the second n-type semiconductor layer N2. Specifically, the insulating layer IL can cover an entire side surface and a part of a top surface of the first n-type semiconductor layer N1, an entire side surface of the first green light emitting layer GE, an entire side surface of the first p-type semiconductor layer P1, and an entire side surface of the bonding layer BD. Further, the insulating layer IL can cover an entire side surface and a part of a top surface of the second p-type semiconductor layer P2, an entire side surface of the second light emitting layer RE, and an entire side surface and a part of a top surface of the second n-type semiconductor layer N2.

Referring to FIGS. 3A, 3C, and 3D together, among the plurality of light emitting elements LED, the second light emitting element LED2 includes a first n-type semiconductor layer N1, a first blue light emitting layer BE, a first p-type semiconductor layer P1, a bonding layer BD, a second p-type semiconductor layer P2, a second light emitting layer RE, a second n-type semiconductor layer N2, a first n-type electrode NE1, a second n-type electrode NE2, and a p-type electrode PE. As compared with the first light emitting element LED1, the second light emitting element LED2 has substantially the same configuration except that the first blue light emitting layer BE is included instead of the first green light emitting layer GE.

The first blue light emitting layer BE is disposed between the first n-type semiconductor layer N1 and the first p-type semiconductor layer P1. The first blue light emitting layer BE is supplied with holes and electrons from the first n-type semiconductor layer N1 and the first p-type semiconductor layer P1 to emit light. For example, the first blue light emitting layer BE can emit blue light by holes and electrons supplied from the first n-type semiconductor layer N1 and the first p-type semiconductor layer P1. The first blue light emitting layer BE can be formed by a single layer or a multi-quantum well (MQW) structure, and for example, can be formed of indium gallium nitride (InGaN), gallium nitride (GaN), or the like, but is not limited thereto.

Hereinafter, a manufacturing method of the wafer 100 according to an exemplary embodiment of the present disclosure will be described with reference to FIGS. 4A to 4G.

FIGS. 4A to 4G are process diagrams for explaining a method for manufacturing a wafer according to an exemplary embodiment of the present disclosure. Specifically, FIGS. 4A to 4G are schematic cross-sectional views for explaining a process of forming a plurality of light emitting elements LED on a substrate 110.

Figure 4A:
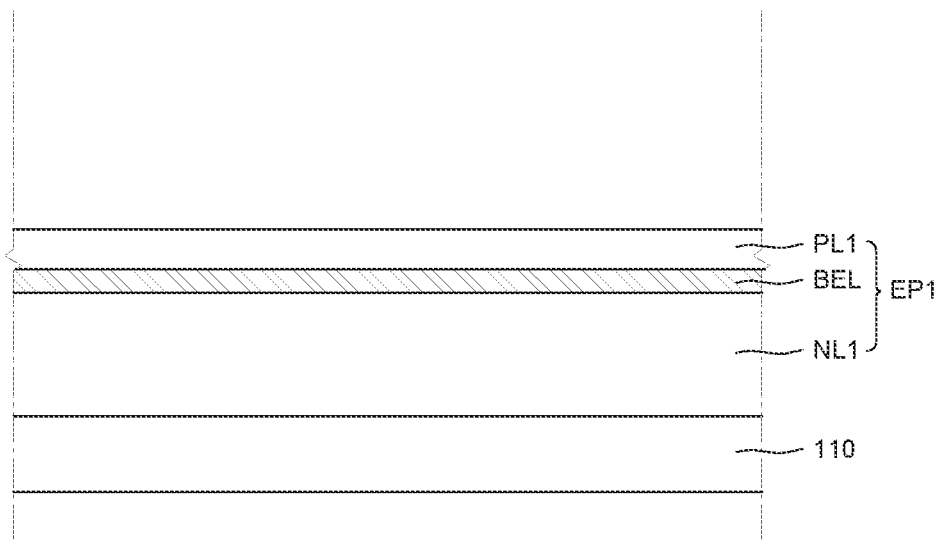
FIGS. 4A to 4G are process diagrams for explaining a method for manufacturing a wafer according to an exemplary embodiment of the present disclosure.

Referring to FIG. 4A, a first epitaxial layer EP1 is formed on the substrate 110. The first epitaxial layer EP1 is used to form a plurality of light emitting elements LED and has a structure in which materials for forming the first n-type semiconductor layer N1, the first green light emitting layer GE, and the first p-type semiconductor layer P1 are sequentially laminated. Alternatively, first epitaxial layer EP1 can have a structure in which materials for forming the first n-type semiconductor layer N1, the first blue light emitting layer BE, and the first p-type semiconductor layer P1 are sequentially laminated. Hereinafter, for the convenience of description, it is described by assuming that the first epitaxial layer EP1 includes a material for forming the first blue light emitting layer BE, but the first epitaxial layer EP1 can also include a material for forming the first green light emitting layer GE, and is not limited thereto.

First, a first n-type semiconductor material layer NL1 can be formed by growing a semiconductor crystal on the substrate 110. Next, a semiconductor crystal is grown on the first n-type semiconductor material layer NL1 to form a first blue light emitting material layer BEL and a first p-type semiconductor material layer PL1. In this case, the first blue light emitting material layer BEL can be grown by inheriting crystallinity of the first n-type semiconductor material layer NL1 and the first p-type semiconductor material layer PL1 grown on the first blue light emitting material layer BEL can be grown by inheriting crystallinity of the first blue light emitting material layer BEL. Accordingly, the first n-type semiconductor material layer NL1, the first blue light emitting material layer BEL, and the first p-type semiconductor material layer PL1 are sequentially grown on the substrate 110 to form the first epitaxial layer EP1.

At this time, the first epitaxial layer EP1 can be grown on the substrate 110 by metal organic chemical vapor deposition (MOCVD), sputtering, or the like, but the growing method of the first epitaxial layer EP1 is not limited thereto.

Figure 4B:
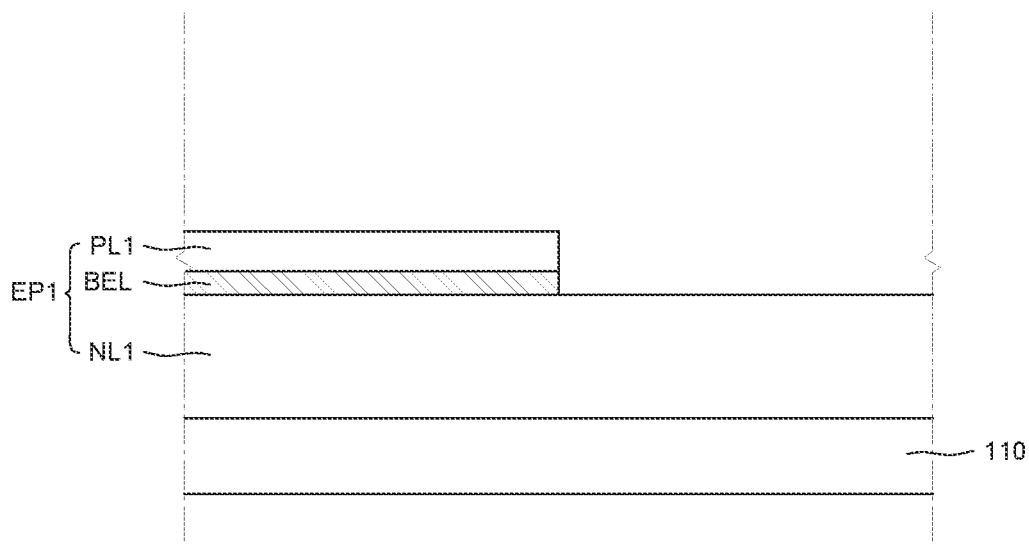

Next, referring to FIG. 4B, the first p-type semiconductor material layer PL1 and the first blue light emitting material layer BEL which overlap an area in which a first light emitting element LED1 among the plurality of light emitting elements LED is formed are removed. Accordingly, only the first n-type semiconductor material layer NL1 is disposed on a partial area of the substrate 110 which overlaps the area in which the first light emitting element LED1 is formed. Further, the first n-type semiconductor material layer NL1, the first blue light emitting material layer BEL, and the first p-type semiconductor material layer PL1 are disposed on the other partial area of the substrate 110 which overlaps an area in which the second light emitting element LED2 is formed.

Figure 4C:
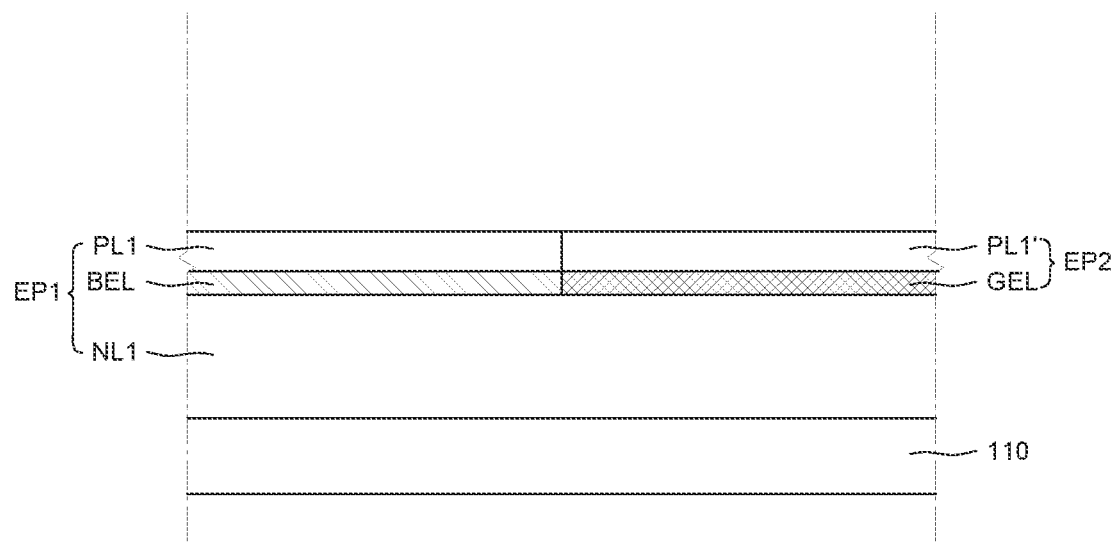

Next, referring to FIG. 4C, a second epitaxial layer EP2 is formed on the substrate 110. The second epitaxial layer EP2 can have a structure in which materials forming the first green light emitting layer GE and the first p-type semiconductor layer P1 are sequentially laminated.

First, a first green light emitting material layer GEL can be formed by growing a semiconductor crystal on the substrate 110. Next, a first p-type semiconductor material layer PL1' can be formed by growing a semiconductor crystal on the first green light emitting material layer GEL.

In the meantime, the second epitaxial layer EP2 can be formed on the entire substrate 110. The first green light emitting material layer GEL and the first p-type semiconductor material layer PL1' are formed on the entire substrate 110 so as to cover the first p-type semiconductor material layer PL1 and the first n-type semiconductor material layer NL1 of the first epitaxial layer EP1. In this case, a part of the second epitaxial layer EP2 formed on the first p-type semiconductor material layer PL1 of the first epitaxial layer EP1 can be removed for a bonding process of a third epitaxial layer EP3 to be described below. In order to bond the third epitaxial layer EP3, the first p-type semiconductor material layer PL1 of the first epitaxial layer EP1 and the first p-type semiconductor material layer PL1' of the second epitaxial layer EP2 need to have a flat top surface. Therefore, a part of the second epitaxial layer EP2 formed on the first p-type semiconductor material layer PL1 can be removed. Accordingly, only the first green light emitting material layer GEL and the first p-type semiconductor material layer PL1' of the second epitaxial layer EP2 which are formed on the first n-type semiconductor material layer NL1 of the first epitaxial layer EP1 can remain on the substrate 110.

Further, the second epitaxial layer EP2 can be formed only on the first n-type semiconductor material layer NL1 exposed from the first blue light emitting material layer BEL. The first green light emitting material layer GEL and the first p-type semiconductor material layer PL1' of the second epitaxial layer EP2 can be formed to cover only the first n-type semiconductor material layer NL1 of the first epitaxial layer EP1. For example, after forming a separate insulating film to cover the first p-type semiconductor material layer PL1 of the first epitaxial layer EP1 so as not to grow the second epitaxial layer EP2 on the first p-type semiconductor material layer PL1 of the first epitaxial layer EP1, the second epitaxial layer EP2 can be grown only on the first n-type semiconductor material layer NL1. Further, when the second epitaxial layer EP2 is grown only on the first n-type semiconductor material layer NL1 of the first epitaxial layer EP1, the process of removing a part of the second epitaxial layer EP2 which covers the first p-type semiconductor material layer PL1 of the first epitaxial layer EP1 can be omitted. However, the growing area of the second epitaxial layer EP2 can vary depending on the design, so that it is not limited thereto.

Accordingly, materials for forming the first n-type semiconductor layer N1, the first blue light emitting layer BE, the first p-type semiconductor layer P1, and the first n-type semiconductor layer N1 of the first light emitting element LED1 can be formed by growing the first epitaxial layer EP1 on the substrate 110. Further, materials for forming the first green light emitting layer GE and the first p-type semiconductor layer P1 of the first light emitting element LED1 can be formed by growing the second epitaxial layer EP2 on the substrate 110.

Figure 4D:
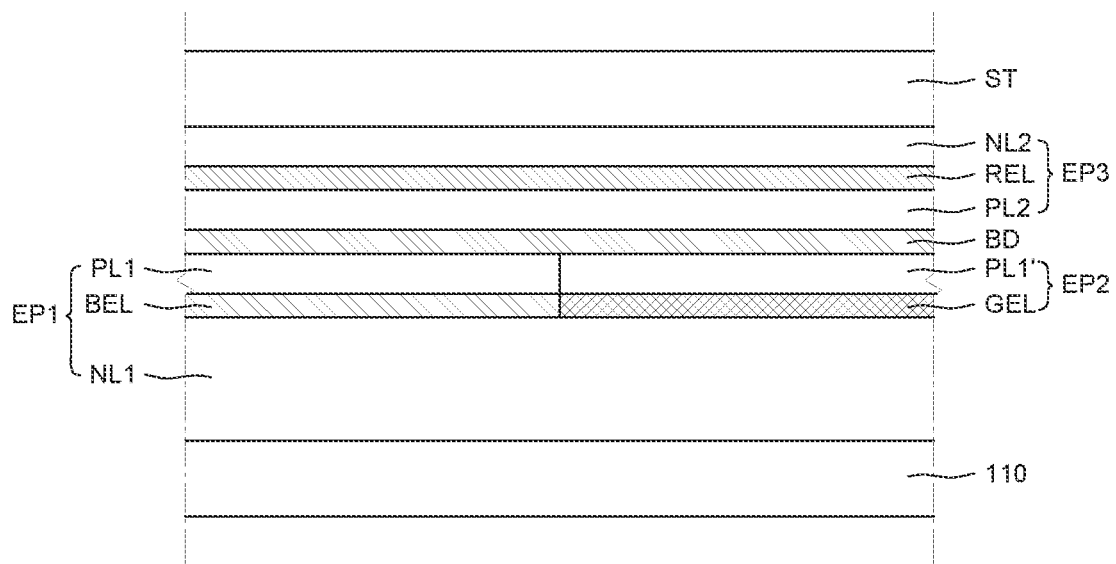

Next, referring to FIG. 4D, a third epitaxial layer EP3 is bonded onto the first epitaxial layer EP1 and the second epitaxial layer EP2. After forming the bonding layer BD between the first epitaxial layer EP1 and the second epitaxial layer EP2 and the third epitaxial layer EP3, the third epitaxial layer EP3 can be bonded to the first epitaxial layer EP1 and the second epitaxial layer EP2.

First, the third epitaxial layer EP3 can be formed on a temporary substrate ST. The third epitaxial layer EP3 is used to form the plurality of light emitting elements LED and has a structure in which materials for forming the second n-type semiconductor layer N2, the second light emitting layer RE, and the second p-type semiconductor layer P2 are sequentially laminated.

The second n-type semiconductor material layer NL2 can be formed by growing a semiconductor crystal on the temporary substrate ST. Next, a second light emitting material layer REL and a second p-type semiconductor material layer PL2 can be formed by growing a semiconductor crystal grows on the second n-type semiconductor material layer NL2. Accordingly, the third epitaxial layer EP3 can be formed by sequentially growing the second n-type semiconductor material layer NL2, the second light emitting material layer REL, and the second p-type semiconductor material layer PL2 on the temporary substrate ST.

At this time, the third epitaxial layer EP3 can be formed on the temporary substrate ST which is different from the substrate 110 on which the first epitaxial layer EP1 and the second epitaxial layer EP2 are grown, due to a growth efficiency of the third epitaxial layer EP3. Specifically, growth efficiencies of the first epitaxial layer EP1, the second epitaxial layer EP2, and the third epitaxial layer EP3 which include light emitting material layers which emit different color lights can vary depending on a type of the substrate 110. For example, when the substrate 110 is a gallium nitride substrate or a sapphire substrate, the first epitaxial layer EP1 and the second epitaxial layer EP2 which include the first blue light emitting material layer BEL and the first green light emitting material layer GEL can be easily grown on the substrate 110. In contrast, the third epitaxial layer EP3 including the second light emitting material layer REL which emits red light has a low growth efficiency so that it is difficult to grow the third epitaxial layer EP3. For example, when the substrate 110 is a gallium arsenide substrate or a gallium phosphate substrate, the third epitaxial layer EP3 including the second light emitting material layer REL which emits red light can be efficiently grown on the substrate 110. Accordingly, the first epitaxial layer EP1 and the second epitaxial layer EP2 can be grown on one substrate 110 and the third epitaxial layer EP3 can be grown on a temporary substrate ST which is different from the substrate 110 on which the first epitaxial layer EP1 and the second epitaxial layer EP2 are grown.

Next, the bonding layer BD can be formed above the third epitaxial layer EP3 or above the first epitaxial layer EP1 and the second epitaxial layer EP2. For example, the bonding layer BD can be formed on the second p-type semiconductor material layer PL2 of the third epitaxial layer EP3 or the bonding layer BD can be formed on the first p-type semiconductor material layers PL1 and PL1' of the first epitaxial layer EP1 and the second epitaxial layer EP2.

Next, after placing the temporary substrate ST such that the first epitaxial layer EP1 and the second epitaxial layer EP2 are opposite to the third epitaxial layer EP3, the third epitaxial layer EP3 and the first epitaxial layer EP1 and the second epitaxial layer EP2 can be bonded. The temporary substrate ST and the substrate 110 are located such that the second p-type semiconductor material layer PL2 of the third epitaxial layer EP3 is opposite to the first p-type semiconductor material layer PL1 of the first epitaxial layer EP1 and the first p-type semiconductor material layer PL1' of the second epitaxial layer EP2 with the bonding layer BD therebetween. Thereafter, the substrate 110 and the temporary substrate ST are bonded to bond the first epitaxial layer EP1 and the second epitaxial layer EP2 and the third epitaxial layer EP3.

Figure 4E:
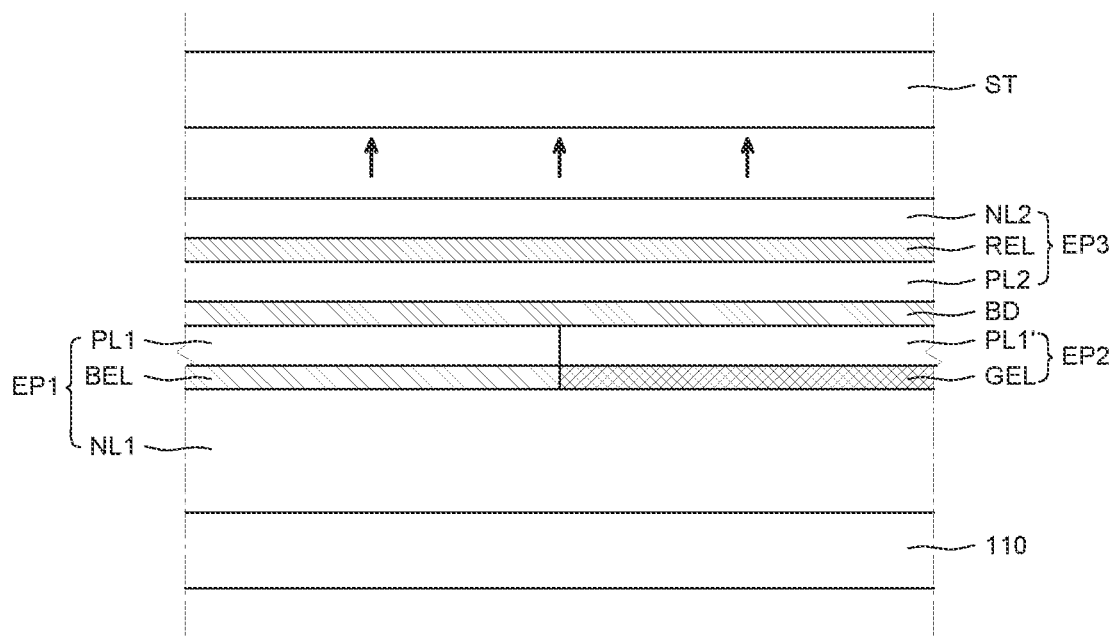

Referring to FIG. 4E, after completely bonding the first epitaxial layer EP1 and the second epitaxial layer EP2 and the third epitaxial layer EP3, the temporary substrate ST is removed. The temporary substrate ST can be stripped from the third epitaxial layer EP3. For example, the temporary substrate ST can be stripped from the third epitaxial layer EP3 by a laser lift off (LLO) technique.

According to the laser lift off technique, when the laser is irradiated onto the temporary substrate ST, the laser is absorbed at an interface of the second n-type semiconductor material layer NL2 and the temporary substrate ST so that the second n-type semiconductor material layer NL2 and the temporary substrate ST can be separated. However, the temporary substrate ST can be separated by other method than the laser lift off technique, and is not limited thereto.

Figure 4F:
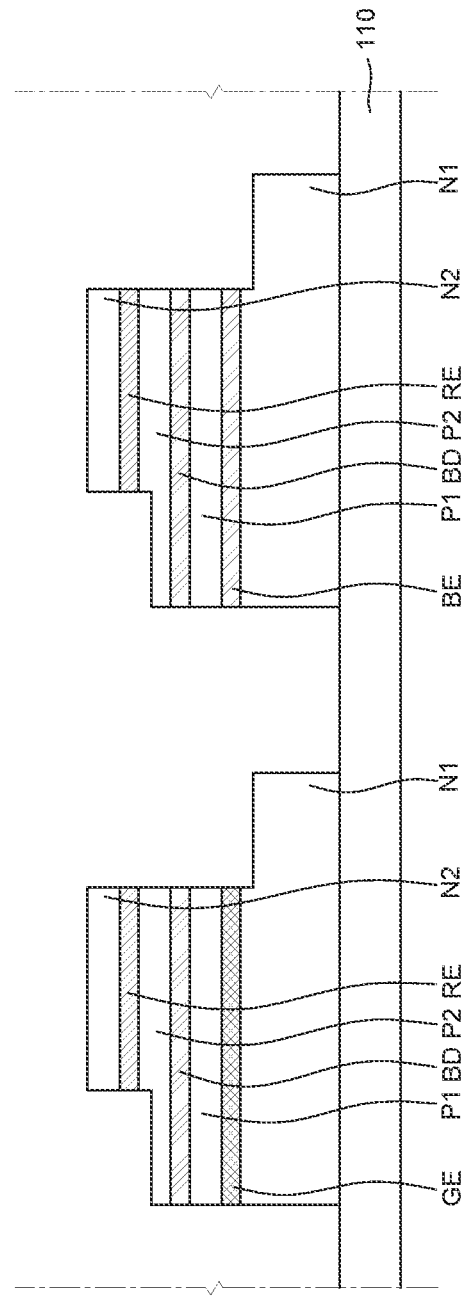

Next, referring to FIG. 4F, the first epitaxial layer EP1, the second epitaxial layer EP2, and the third epitaxial layer EP3 are partially etched. The first n-type semiconductor layer N1, the first green light emitting layer GE, the first p-type semiconductor layer P1, the bonding layer BD, the second p-type semiconductor layer P2, the second light emitting layer RE, and the second n-type semiconductor layer N2 of the first light emitting element LED1 can be formed by etching the first epitaxial layer EP1, the second epitaxial layer EP2, and the third epitaxial layer EP3. The first n-type semiconductor layer N1, the first blue light emitting layer BE, the first p-type semiconductor layer P1, the bonding layer BD, the second p-type semiconductor layer P2, the second light emitting layer RE, and the second n-type semiconductor layer N2 of the second light emitting element LED2 can be formed by etching the first epitaxial layer EP1, the second epitaxial layer EP2, and the third epitaxial layer EP3.

First, the second n-type semiconductor layer N2 and the second light emitting layer RE of each of the first light emitting element LED1 and the second light emitting element LED2 can be formed by etching the second n-type semiconductor material layer NL2 and the second light emitting material layer REL of the third epitaxial layer EP3.

Next, the second p-type semiconductor layer P2, the bonding layer BD, the first p-type semiconductor layer P1, and the first green light emitting layer GE of the first light emitting element LED1 can be formed by etching the second p-type semiconductor material layer PL2, the bonding layer BD, the first p-type semiconductor material layer PL1', and the first green light emitting material layer GEL exposed from the second n-type semiconductor layer N2 and the second light emitting layer RE. Further, the second p-type semiconductor layer P2, the bonding layer BD, the first p-type semiconductor layer P1, and the first blue light emitting layer BE of the second light emitting element LED2 can be formed by etching the second p-type semiconductor material layer PL2, the bonding layer BD, the first p-type semiconductor material layer PL1, and the first blue light emitting material layer BEL exposed from the second n-type semiconductor layer N2 and the second light emitting layer RE with the same width.

Next, the first n-type semiconductor layer N1 of each of the first light emitting element LED1 and the second light emitting element LED2 can be formed by etching the first n-type semiconductor material layer NL1 exposed from the first green light emitting layer GE and the first blue light emitting layer BE.

Accordingly, by partially etching the first epitaxial layer EP1, the second epitaxial layer EP2, and the third epitaxial layer EP3, the first n-type semiconductor layer N1, the first green light emitting layer GE, the first p-type semiconductor layer P1, the bonding layer BD, the second p-type semiconductor layer P2, the second light emitting layer RE, and the second n-type semiconductor layer N2 of the first light emitting element LED1 can be formed. Further, by partially etching the first epitaxial layer EP1, the second epitaxial layer EP2, and the third epitaxial layer EP3, the first n-type semiconductor layer N1, the first blue light emitting layer BE, the first p-type semiconductor layer P1, the bonding layer BD, the second p-type semiconductor layer P2, the second light emitting layer RE, and the second n-type semiconductor layer N2 of the second light emitting element LED2 can be formed.

Figure 4G:
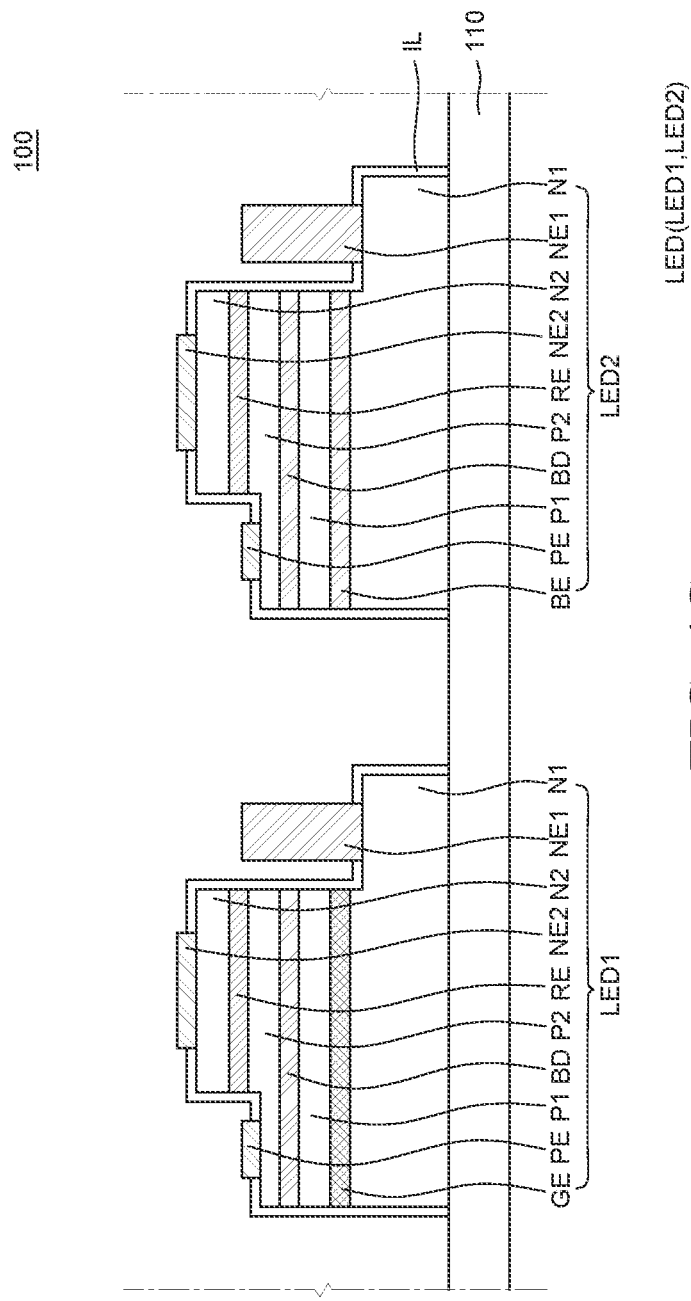

Finally, referring to FIG. 4G, the first n-type electrode NE1, the second n-type electrode NE2, and the p-type electrode PE of the plurality of light emitting elements LED and the insulating layer IL are formed.

The first n-type electrode NE1 is formed on the first n-type semiconductor layer N1 of the first light emitting element LED1, the second n-type electrode NE2 is formed on the second n-type semiconductor layer N2, and the p-type electrode PE is formed on the second p-type semiconductor layer P2. At this time, the first n-type electrode NE1 is disposed so as not to overlap the first green light emitting layer GE and the second light emitting layer RE and is disposed to be most adjacent to the substrate 110 among the first n-type electrode NE1, the second n-type electrode NE2, and the p-type electrode PE. In this case, the first n-type electrode NE1 can be formed of a conductive material which can be formed to have a large thickness to reduce a step, for example, an opaque material such as gold.

Further, the second n-type electrode NE2 and the p-type electrode PE which overlap the first green light emitting layer GE and the second light emitting layer RE can be formed of a transparent material, such as indium tin oxide, to transmit the light emitted from the first green light emitting layer GE and the second light emitting layer RE. Therefore, the first n-type electrode NE1 is formed of a material different from that of the second n-type electrode NE2 and the p-type electrode PE.

Further, the thicknesses thereof are different so that a process for forming the first n-type electrode NE1 and a process for forming the second n-type electrode NE2 and the p-type electrode PE can be individually performed. At this time, the order of the process for forming the first n-type electrode NE1 and the process for forming the second n-type electrode NE2 and the p-type electrode PE can vary depending on the design.

Similarly to the first light emitting element LED1, the first n-type electrode NE1 is formed on the first n-type semiconductor layer N1 of the second light emitting element LED2 and the second n-type electrode NE2 is formed on the second n-type semiconductor layer N2. Further, the p-type electrode PE is formed on the second p-type semiconductor layer P2. At this time, among the first n-type electrode NE1, the second n-type electrode NE2, and the p-type electrode PE, the first n-type electrode NE1 which does not overlap the first blue light emitting layer BE and the second light emitting layer RE and is the most adjacent to the substrate 110 can be formed of an opaque material such as gold. Further, the first n-type electrode NE1 can be formed with a relatively thick thickness. Further, the second n-type electrode NE2 and the p-type electrode PE which overlap the first blue light emitting layer BE and the second light emitting layer RE can be formed of a transparent material such as indium tin oxide to transmit light emitted from the first blue light emitting layer BE and the second light emitting layer RE.

Further, the first n-type electrode NE1 of the first light emitting element LED1 and the first n-type electrode NE1 of the second light emitting element LED2 can be formed of the same material and by the same process. Further, the second n-type electrode NE2 and the p-type electrode PE of the first light emitting element LED1 and the second n-type electrode NE2 and the p-type electrode PE of the second light emitting element LED2 can be formed of the same material and by the same process.

Next, the insulating layer IL which encloses the first light emitting element LED1 and the second light emitting element LED2 is formed. The insulating layer IL can cover the remaining first light emitting element LED1 and the second light emitting element LED2 except for the first n-type electrode NE1, the second n-type electrode NE2, and a part of the p-type electrode PE of the first light emitting element LED1 and the second light emitting element LED2.

In the meantime, the insulating layer IL can be formed before forming the first n-type electrode NE1, the second n-type electrode NE2, and the p-type electrode PE of the first light emitting element LED1 and the second light emitting element LED2. Further, the insulating layer IL can be formed after forming the first n-type electrode NE1, the second n-type electrode NE2, and the p-type electrode PE of the first light emitting element LED1 and the second light emitting element LED2. For example, the insulating layer IL which covers the first n-type semiconductor layer N1, the first green light emitting layer GE, and the first blue light emitting layer BE, the first p-type semiconductor layer P1, the bonding layer BD, the second p-type semiconductor layer P2, the second light emitting layer RE, and the second n-type semiconductor layer N2 is formed. After the insulating layer IL is formed, a contact hole which exposes part of top surfaces of the first n-type semiconductor layer N1, the second n-type semiconductor layer N2, and the second p-type semiconductor layer P2 can be formed.

Further, the first n-type electrode NE1, the second n-type electrode NE2, and the p-type electrode PE are formed to be filled in the contact hole formed in the insulating layer IL to complete the formation of the wafer 100 on which the first light emitting element LED1 and the second light emitting element LED2 are formed. For example, in a state in which all the first n-type electrode NE1, the second n-type electrode NE2, and the p-type electrode PE are formed, the insulating layer IL is formed on the entire substrate 110 and the contact hole which exposes the first n-type electrode NE1, the second n-type electrode NE2, and the p-type electrode PE from the insulating layer IL is formed. By doing this, the formation of the wafer 100 on which the first light emitting element LED1 and the second light emitting element LED2 are formed is completed. However, the order of forming the insulating layer IL can vary depending on the design, but it is not limited thereto.

In the wafer 100 according to an exemplary embodiment of the present disclosure, a plurality of light emitting elements LED which emits red light, green light, and blue light is formed together on one substrate 110 to simplify the transferring process. On one substrate 110, the first light emitting element LED1 including the first green light emitting layer GE which emits green light and the second light emitting layer RE which emits red light and the second light emitting element LED2 including the first blue light emitting layer BE which emits blue light and the second light emitting layer RE which emits red light can be formed together. Specifically, the first epitaxial layer EP1 and the second epitaxial layer EP2 including the first green light emitting layer GE and the first blue light emitting layer BE which are easily grown are grown on one substrate 110.

Further, a third epitaxial layer EP3 including the second light emitting layer RE grown on the temporary substrate ST is grown on the temporary substrate ST. Further, the bonding layer BD is formed between the first epitaxial layer EP1 and the second epitaxial layer EP2 and the third epitaxial layer EP3 to bond the third epitaxial layer EP3 to the first epitaxial layer EP1 and the second epitaxial layer EP2. Further, a plurality of first epitaxial layers EP1, second epitaxial layer EP2, and third epitaxial layer EP3 is patterned and the electrode is formed to form the plurality of light emitting elements LED.

Accordingly, in the wafer 100 according to the exemplary embodiment of the present disclosure, the light emitting element LED including the red light emitting layer, the green light emitting layer, and the blue light emitting layer can be formed on one substrate 110.

If, after forming a light emitting element including a red light emitting layer, a light emitting element including a green light emitting layer, and a light emitting element including a blue light emitting layer on different substrates, respectively, then when the light emitting elements are transferred to a back plane, the number of times of transferring processes may be increased. Further, an alignment error of the plurality of light emitting elements may occur.

In contrast, in the wafer 100 according to the exemplary embodiment of the present disclosure, a plurality of light emitting elements LED including the red light emitting layer, the green light emitting layer, and the blue light emitting layer is formed on one substrate 110 to be transferred onto the back plane at one time. Therefore, the alignment error between the red light emitting layer, the green light emitting layer, and the blue light emitting layer can be minimized, the transferring process can be simplified and the cost can be reduced.

In the wafer 100 according to the exemplary embodiment of the present disclosure, the first light emitting element LED1 includes the first green light emitting layer GE and the second light emitting layer RE which are vertically laminated and the second light emitting element LED2 includes the first blue light emitting layer BE and the second light emitting layer RE which are vertically laminated. Therefore, an area occupied by the plurality of light emitting elements LED can be reduced.

Specifically, the second light emitting layer RE which is a red light emitting layer is not disposed on the same plane as the first green light emitting layer GE and the first blue light emitting layer BE, but is disposed on the first green light emitting layer GE and the first blue light emitting layer BE. Therefore, the area in the substrate 110 occupied by the second light emitting layer RE can be reduced. If the second light emitting layer RE is disposed on the same plane as the first green light emitting layer GE and the first blue light emitting layer BE, the space on the substrate 110 in which the second light emitting layer RE is to be disposed needs to be secured. Therefore, the number of light emitting elements LED which can be formed on one substrate 110 may be limited. In contrast, in the wafer 100 according to the exemplary embodiment of the present disclosure, the first green light emitting layer GE, and the first blue light emitting layer BE, and the second light emitting layer RE are vertically laminated to reduce the area occupied by the second light emitting layer RE. Further, the number of light emitting elements LED which can be formed on one substrate 110 can be increased. Accordingly, in the wafer 100 according to the exemplary embodiment of the present disclosure, light emitting layers which emit different color lights are laminated to reduce the area occupied by one light emitting element LED and easily facilitate the space utilization.

Figure 5:
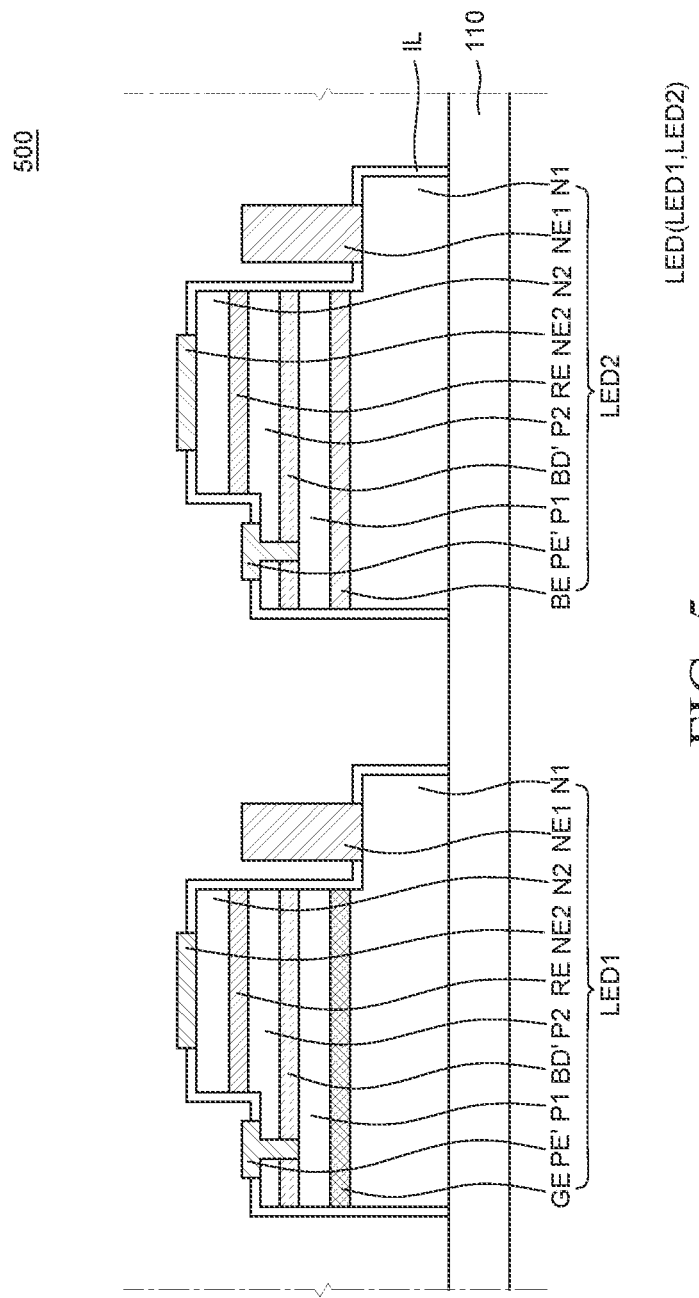
FIG. 5 is a cross-sectional view of a wafer according to another embodiment of the present disclosure.

FIG. 5 is a cross-sectional view of a wafer according to another embodiment of the present disclosure. As compared with the wafer 100 of FIGS. 1 to 3D, only a bonding layer BD' and a p-type electrode PE' of a wafer 500 of FIG. 5 can be different, but other configurations are the same or substantially the same so that a redundant description will be omitted or may be briefly provided.

Referring to FIG. 5, bonding layers BD' of the first light emitting element LED1 and the second light emitting element LED2 can be formed of a non-conductive material having a high transmittance. The bonding layer BD' is formed of resin such as benzocyclobutene (BCB) to bond the first p-type semiconductor layer P1 and the second p-type semiconductor layer P2.

In the meantime, when the bonding layer BD' is formed of a non-conductive material, the p-type electrode PE' passes through the second p-type semiconductor layer P2 and the bonding layer BD' to be electrically connected to the first p-type semiconductor layer P1. Specifically, when the bonding layer BD' is formed of a non-conductive material, the second p-type semiconductor layer P2 and the first p-type semiconductor layer P1 which are disposed with the bonding layer BD' therebetween can be electrically insulated. Accordingly, in order to electrically connect the p-type electrode PE' disposed on a top surface of the second p-type semiconductor layer P2 to the first p-type semiconductor layer P1, the contact hole which exposes the first p-type semiconductor layer P1 can be formed on the second p-type semiconductor layer P2 and the bonding layer BD'. Further, the p-type electrode PE' can be electrically connected to the first p-type semiconductor layer P1 by means of the contact hole.

In the wafer 500 according to another exemplary embodiment of the present disclosure, the p-type electrode PE' can be designed depending on a material of the bonding layers BD and BD'. For example, like the wafer 100 of FIGS. 1 to 3D, if the bonding layer BD is formed of a conductive material, the p-type electrode PE is in contact with a top surface of the second p-type semiconductor layer P2 to be electrically connected to both the first p-type semiconductor layer P1 and the second p-type semiconductor layer P2. In contrast, like the wafer 500 of FIG. 5, if the bonding layer BD' is formed of a non-conductive material, a part of the p-type electrode PE' passes through the second p-type semiconductor layer P2 and the bonding layer BD' to be electrically connected to the first p-type semiconductor layer P1. Accordingly, in consideration of the materials of the bonding layers BD and BD', an electrical connection method of the p-type electrode PE' and the first p-type semiconductor layer P1, and the second p-type semiconductor layer P2 can be designed in various ways.

FIGS. 6A to 6D are views illustrating a display device according to an exemplary embodiment of the present disclosure.

Figure 6A:
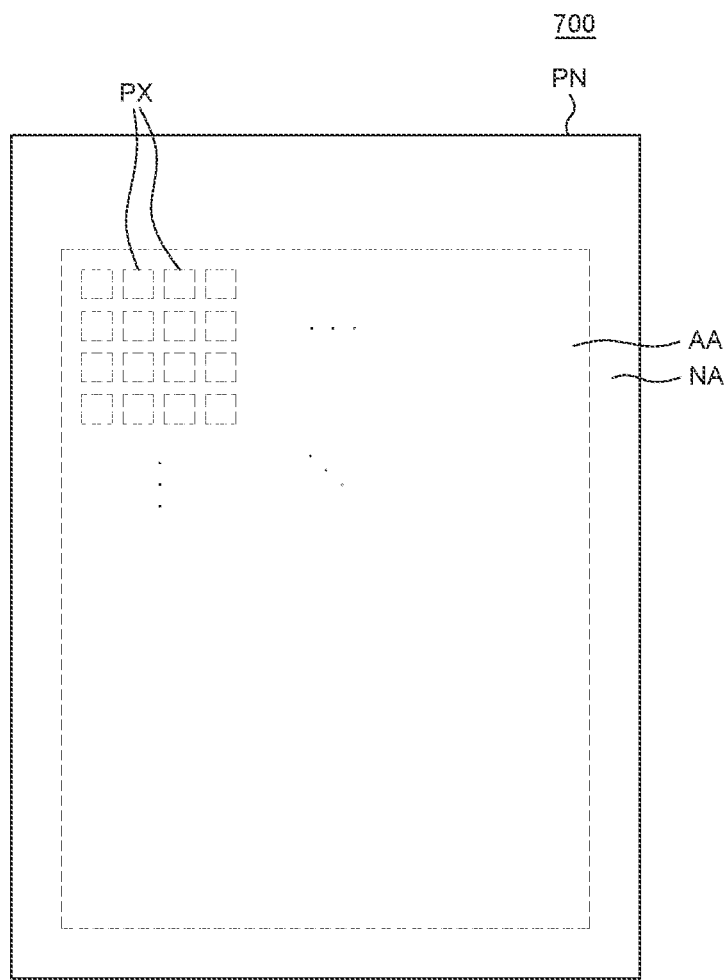
FIGS. 6A to 6D are views illustrating a display device according to an exemplary embodiment of the present disclosure.

The display device 700 can be manufactured using the light emitting element LED described with reference to FIGS. 1 to 5. In FIG. 6A, for the convenience of description, among components of the display device 700, the display panel PN and the plurality of pixels PX are illustrated.

The display panel PN can include a display area AA and a non-display area NA. The display area AA is an area where images are displayed. In the display area AA, a plurality of pixels PX for expressing the images and a circuit for driving the plurality of pixels PX can be disposed. The circuit can include a thin film transistor TFT, a capacitor, a wiring line, and the like. For example, the circuit can include components such as a driving transistor, a switching transistor, a storage capacitor, a gate line, and a data line, but is not limited thereto. The non-display area NA is an area where no image is displayed and driving ICs, wiring lines, and the like for driving the pixels PX disposed in the display area AA are disposed. For example, in the non-display area NA, a gate driver IC, a data driver IC, and the like can be disposed. Even though in FIG. 6A, it is illustrated that the non-display area NA encloses the display area AA, the non-display area NA can be an area extending from one side of the display area AA, but is not limited thereto.

The plurality of pixels PX is disposed in the display area AA. Each of the pixels PX can be configured to include the light emitting elements LED described with reference to FIGS. 1 to 5. Generally, one pixel PX is configured to include red, green, and blue light emitting elements so that the pixel PX of the present disclosure can be configured to include two or more light emitting elements LED of FIGS. 1 to 5.

Figure 6B:
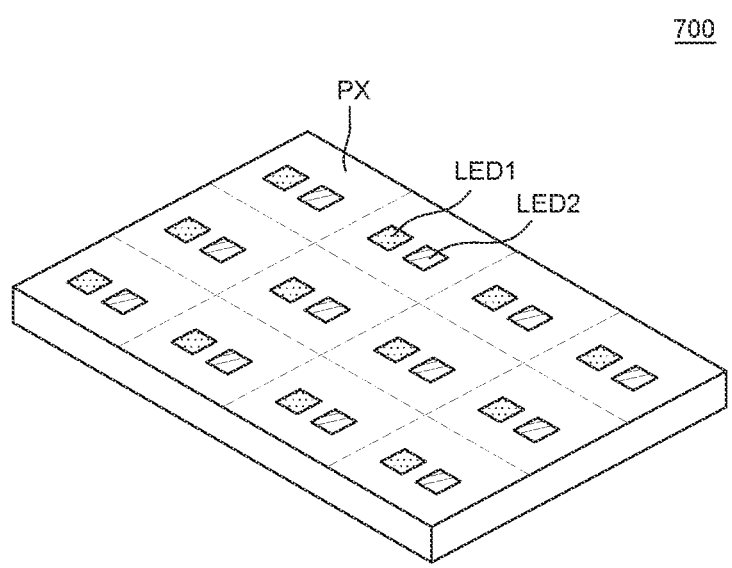

FIG. 6B illustrates a display device 700 in which two light emitting elements LED of FIGS. 1 to 5 are disposed in each pixel PX. The light emitting elements LED can be disposed in one pixel PX in parallel. The light emitting elements LED can be the first light emitting element LED1 and the second light emitting element LED2 illustrated in FIG. 3. For example, one pixel PX emits red light, green light, and blue light using two light emitting elements and various colors can be implemented with a combination thereof. Accordingly, according to the structure of the pixel PX, the space utilization is increased and when the pixel structure is utilized for a transparent display device, an aperture ratio can be significantly improved. Further, in the display device which employs the pixel PX structure, as described above, the process of transferring the light emitting element LED is reduced by ⅓, so that a production cost can be saved. In the meantime, the number of light emitting elements LED disposed in one pixel PX can be variously configured depending on the exemplary embodiments.

Figure 6C:
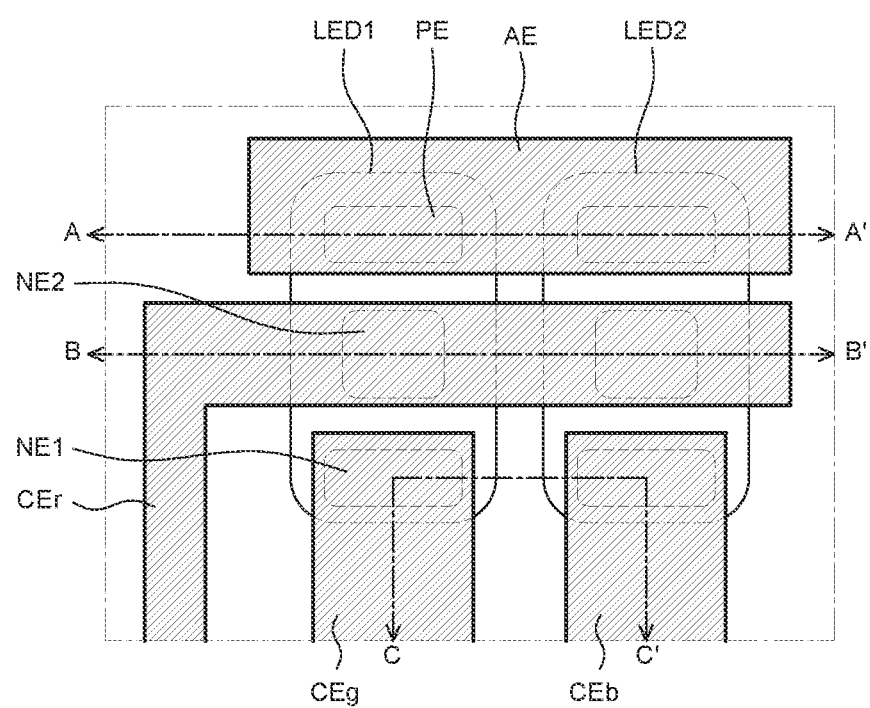

FIG. 6C is an example illustrating a connection structure of the pixel PX in which two light emitting elements LED are disposed. Two light emitting elements LED can be connected to a predetermined pixel circuit to be driven. The pixel circuit is implemented with a known structure such as 2T1C or 7T1C to drive the light emitting element LED. As illustrated in FIG. 6B, two light emitting elements LED1 and LED2 disposed in one pixel PX can be connected to the pixel circuit as follows.

The p-type electrodes PE of two light emitting elements LED are connected to a high potential voltage VDD and n-type electrodes NE1 and NE2 of two light emitting elements LED are connected to separate driving transistors. Such a structure is also referred to as a common anode structure.

At this time, the high potential voltage VDD is supplied to the p-type electrodes PE of the first light emitting element LED1 and the second light emitting element LED2 by means of the common electrode AE. In the meantime, i) the red light emitting layers RE of the first light emitting element LED1 and the second light emitting element LED2 are connected to a driving transistor TFT R by a first connecting unit CEr associated therewith to be controlled. Further, ii) the green light emitting layer GE of the first light emitting element LED1 is controlled by the driving transistor TFT_G associated therewith. At this time, the first n-type electrode NE1 of the first light emitting element LED1 is connected to a source/drain of the driving transistor TFT_G by a second connecting unit CEg. Further, iii) the blue light emitting layer BE of the second light emitting element LED2 is controlled by a driving transistor TFT_B associated therewith. At this time, the first n-type electrode NE1 of the second light emitting element LED2 is connected to a source/drain of the driving transistor TFT_B by a third connecting unit CEb.

Figure 6D:
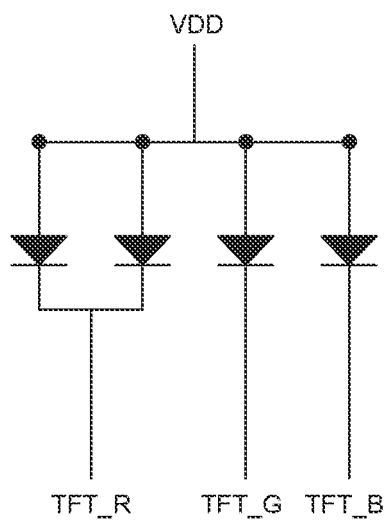

An equivalent circuit which schematically illustrates a connection structure as illustrated in FIG. 6C is illustrated in FIG. 6D. The first light emitting element LED1 and the second light emitting element LED2 each include two types of light emitting elements so that one pixel PX drives a total of four light emitting elements to emit light. Anodes of four light emitting elements are connected to the same power source VDD and cathodes of four light emitting elements are connected to the driving transistors TFT R, TFT_G, and TFT_B, respectively. At this time, the light emitting layers (for example, red light emitting layers) which are included in both the first light emitting element LED1 and the second light emitting element LED2 can be controlled by the same driving transistor (for example, TFT R). Further, different light emitting layers (for example, the green light emitting layer and the blue light emitting layer) which are included in the first light emitting element LED1 and the second light emitting element LED2 can be controlled by different driving transistors (for example, TFT_G and TFT_B).

Figure 7A:
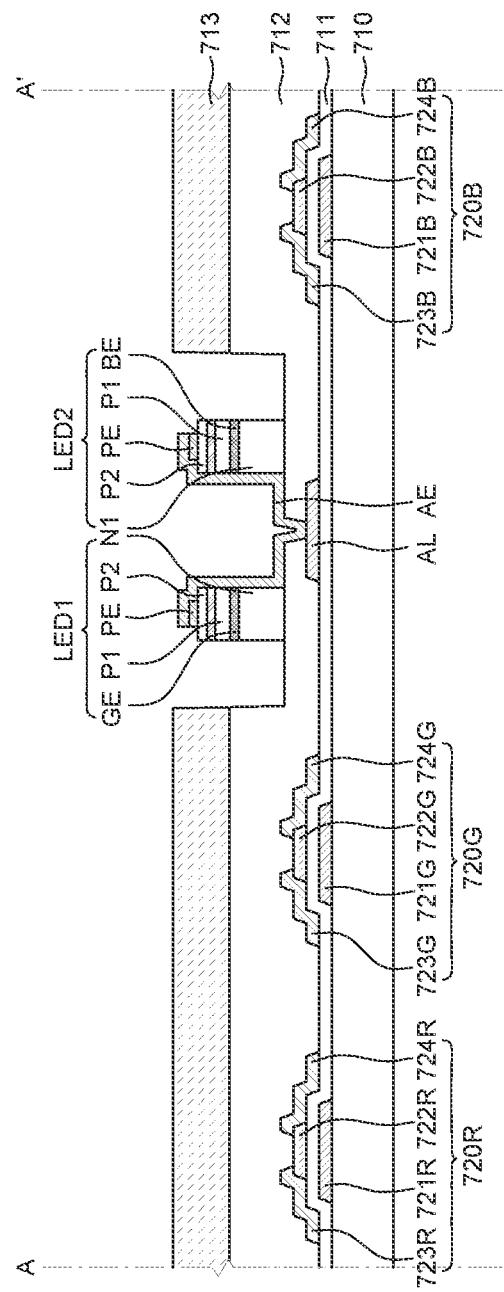
FIGS. 7A to 7C are cross-sectional views illustrating a display device according to an exemplary embodiment of the present disclosure.
Figure 7B:
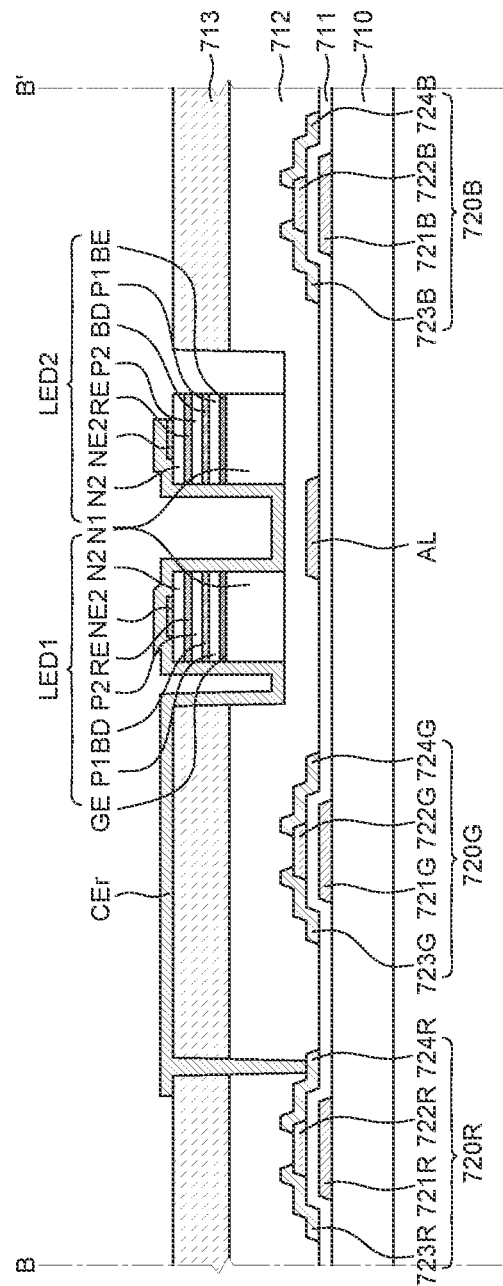
Figure 7C:
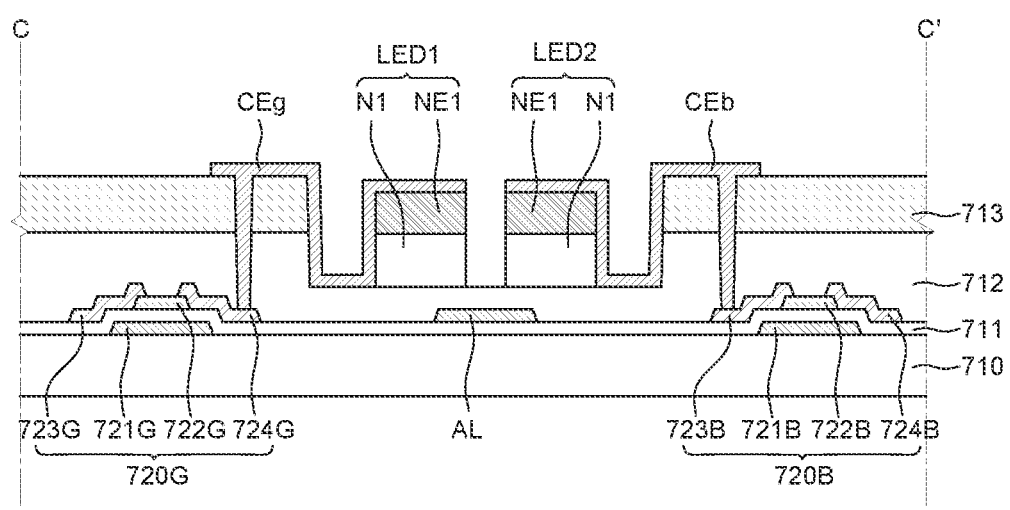

FIGS. 7A to 7C are cross-sectional views illustrating a display device according to an exemplary embodiment of the present disclosure.

The display device can be manufactured to include a plurality of light emitting elements LED described with reference to FIGS. 1 to 5. FIG. 7A is a cross-sectional view taken along the line A-A' of FIG. 6C, FIG. 7B is a cross-sectional view taken along line B-B' of FIG. 6C, and FIG. 7C is a cross-sectional view taken along line C-C' of FIG. 6C. Hereinafter, the description will be made with reference to FIGS. 7A to 7C.

The display device 700 according to an exemplary embodiment of the present disclosure incudes a substrate 710 and a first light emitting element LED1 and a second light emitting element LED2. The substrate 710 includes a display area AA in which a plurality of pixels PX is disposed and the non-display area NA in the vicinity of the display area. The first light emitting element LED1 and the second light emitting element LED2 are disposed in each of the plurality of pixels. The first light emitting element LED1 and the second light emitting element LED2 are light emitting elements which emit two or more colors of light. For example, the first light emitting element LED1 can emit green light and red light and the second light emitting element LED2 can emit blue light and red light.

The substrate 710 is a support member for supporting components of the display device 700 and can be configured by an insulating material. For example, the substrate 710 can be formed of glass, resin, or the like. Further, the substrate 710 can be configured to include plastics such as polymer or polyimide (PI) or can be formed of another material having flexibility.

Driving transistors 720R, 720G, and 720B are disposed on the substrate 710. The driving transistors 720R, 720G, and 720B can be used as driving elements of the display device 700. The driving transistors 720R, 720G, and 720B include gate electrodes 721R, 721G, 721B, active layers 722R, 722G, 722B, source electrodes 723R, 723G, 723B, and drain electrodes 724R, 724G, 724B.

The gate electrodes 721R, 721G, 721B are disposed on the substrate 710. The gate electrodes 721R, 721G, 721B can be formed of a conductive material such as copper (Cu), aluminum (Al), molybdenum (Mo), titanium (Ti), or an alloy thereof, but is not limited thereto.

The gate insulating layer 711 is disposed on the gate electrodes 721R, 721G, 721B. The gate insulating layer 711 is a layer which insulates the gate electrodes 721R, 721G, 721B from the active layers 722R, 722G, and 722B and is formed of an insulating material. For example, the gate insulating layer 711 can be configured by a single layer or a double layer of silicon oxide (SiOx) or silicon nitride (SiNx), but is not limited thereto.

The active layers 722R, 722G, 722B are disposed on the gate insulating layer 711. For example, the active layers 722R, 722G, 722B can be formed of an oxide semiconductor, amorphous silicon, polysilicon, or the like, but is not limited thereto.

The source electrodes 723R, 723G, 723B and the drain electrodes 724R, 724G, and 724B are disposed on the active layers 722R, 722G, 722B to be spaced apart from each other. The source electrodes 723R, 723G, 723B and the drain electrodes 724R, 724G, and 724B can be electrically connected to the active layers 722R, 722G, 722B. The source electrodes 723R, 723G, 723B and the drain electrodes 724R, 724G, and 724B can be formed of a conductive material such as copper (Cu), aluminum (Al), molybdenum (Mo), titanium (Ti), or an alloy thereof, but are not limited thereto.

In the meantime, according to the exemplary embodiment, it is illustrated that in the driving transistors 720R, 720G, 720B, the gate electrodes 721R, 721G, 721B are disposed at a lowest part, the active layers 722R, 722G, 722B are disposed on the gate electrodes 721R, 721G, 721B, and the source electrodes 723R, 723G, 723B and the drain electrodes 724R, 724G, and 724B are disposed on the active layers 722R, 722G, 722B. However, the structure of the driving transistors is not limited thereto.

A common line AL is disposed on the gate insulating layer 711. The common line AL can transmit a common power (for example, VDD) to the first light emitting element LED1 and the second light emitting element LED2. The common line AL can be formed of the same material as the source electrodes 723R, 723G, 723B and/or the drain electrodes 724R, 724G, and 724B and by the same process. In contrast, the common line AL can be formed of the same material on the same layer as the gate electrodes 721R, 721G, 721B.

The first insulating layer 712 is disposed on the driving transistors 720R, 720G, 720B. The first insulating layer 712 protects the driving transistors 720R, 720G, 720B. The first insulating layer 712 can be formed of an organic material such as benzocyclobutene or photo acryl.

The first light emitting element LED1 and the second light emitting element LED2 can be disposed on the first insulating layer 712. The first light emitting element LED1 and the second light emitting element LED2 can be electrically connected to the driving transistors 720R, 720G, 720B and the common electrode AE by means of the contact hole formed in the first insulating layer 712. In the meantime, in FIG. 7A, it is illustrated that the first light emitting element LED1 and the second light emitting element LED2 are disposed on the first insulating layer 712. However, the first light emitting element LED1 and the second light emitting element LED2 can be disposed on the first insulating layer 712 which is not patterned and has a flat top surface.

A second insulating layer 713 is disposed on the first insulating layer 712. The second insulating layer 713 can be formed of an organic material such as benzocyclobutene or photo acryl. Even though in FIG. 7A, it is illustrated that the second insulating layer 713 does not cover the first light emitting element LED1 and the second light emitting element LED2, depending on an implementation example, the second insulating layer 713 can cover the first light emitting element LED1 and the second light emitting element LED2. In this case, the second insulating layer 713 covers upper portions of the first light emitting element LED1 and the second light emitting element LED2 to protect. In order to cover the light emitting didoes, when the height of the second insulating layer 713 is too high, the second insulating layer 713 can be divided into two or more layers. In this case, an additional insulating layer can be further provided above the second insulating layer 713. Even though in FIG. 7A, a lamination structure further includes the additional insulating layer, for the convenience of description, the additional insulating layer disposed on the second insulating layer 713 is omitted. The second insulating layer 713 and the additional insulating layer can protect the light emitting elements and the pixel circuit from external impacts.

The first light emitting element LED1 and the second light emitting element LED2 can be a plurality of light emitting elements with a structure described with reference to FIGS. 1 to 5. For example, each of the first light emitting element LED1 and the second light emitting element LED2 can include a first n-type semiconductor layer N1 disposed on the substrate 710, the first light emitting layer GE, BE disposed on the first n-type semiconductor layer N1, the p-type semiconductor layer P1, P2 disposed on the first light emitting layers GE, BE, the second light emitting layer RE disposed on the p-type semiconductor layer P1, P2, the second n-type semiconductor layer N2 disposed on the second light emitting layer RE, the p-type electrode PE disposed on the p-type semiconductor layer P1, P2, the first n-type electrode NE1 disposed on the first n-type semiconductor layer N1, and the second n-type electrode NE2 disposed on the second n-type semiconductor layer N2.

Further, the p-type semiconductor layer can include the first p-type semiconductor layer P1 disposed on the first light emitting layer GE, BE and the second p-type semiconductor layer P2 disposed on the first p-type semiconductor layer P1. At this time, the entire second p-type semiconductor layer P2, the entire first p-type semiconductor layer P1, and the entire first light emitting layer GE, BE can overlap the first n-type semiconductor layer N1. Further, the entire second n-type semiconductor layer N2 and the entire second light emitting layer RE can overlap the second p-type semiconductor layer P2.

With this placement, the first n-type electrode NE1 is disposed on the first n-type semiconductor layer N1 which does not overlap the first light emitting layer GE, BE and the p-type electrode PE is disposed on the second p-type semiconductor layer P2 which does not overlap the second light emitting layer RE. In a plan view, the second n-type electrode NE2 can be disposed between the first n-type electrode NE1 and the p-type electrode PE.

The first light emitting element LED1 and the second light emitting element LED2 have a common anode structure mentioned above to be connected to the pixel circuit. For example, p-type electrodes PE of two light emitting elements LED1 and LED2 are connected to the same common electrode and n-type electrodes NE1 and NE2 of two light emitting elements LED1 and LED2 can be connected to separate driving transistors.

As an example of a common anode structure, as illustrated in FIG. 7A, the p-type electrode PE of the first light emitting element LED1 and the p-type electrode PE of the second light emitting element LED2 are connected to the same common electrode AE. The common electrode AE is connected to the common line AL to transmit a high potential voltage (VDD) to the first light emitting element LED1 and the second light emitting element LED2. At this time, the common electrode AE can be in contact with the common line AL by means of the contact hole of the first insulating layer 712. The common electrode AE can be formed of a transparent metal oxide such as indium tin oxide (ITO), indium gallium zinc oxide (IGZO), or indium gallium oxide (IGO), but is not limited thereto.

The second n-type electrode NE2 of the first light emitting element LED1 can be connected to the transistor 720R which controls emission of the second light emitting layer RE of the first light emitting element LED1. Further, the second n-type electrode NE2 of the second light emitting element LED2 can be connected to the transistor 720R which controls emission of the second light emitting layer RE of the second light emitting element LED2. At this time, as illustrated in FIG. 7B, the transistor which controls emission of the second light emitting layer RE of the first light emitting element LED1 and the transistor which controls emission of the second light emitting layer RE of the second light emitting element LED2 can be the same transistor 720R. At this time, the second light emitting layers RE of the first light emitting element LED1 and the second light emitting element LED2 are connected to the driving transistor 720R associated therewith by the first connecting unit CEr to be controlled.

In the meantime, as illustrated in FIG. 7C, the first n-type electrode NE1 of the first light emitting element LED1 is connected to the transistor 720G which controls emission of the first light emitting layer GE of the first light emitting element LED1. Further, the first n-type electrode NE1 of the second light emitting element LED2 is connected to the transistor 720B which controls emission of the first light emitting layer BE of the second light emitting element LED2. At this time, the first n-type electrode NE1 of the first light emitting element LED1 is connected to the driving transistor 720G by a second connecting unit CEg. Further, the first n-type electrode NE1 of the second light emitting element LED2 can be connected to the driving transistor 720B by a third connecting unit CEb.

By using this connection, when the voltage is applied to the first n-type electrode NE1 and the p-type electrode PE, in the first light emitting element LED1 and the second light emitting element LED2, the first light emitting layer GE, BE can emit light. Further, in the first light emitting element LED1 and the second light emitting element LED2, when the voltage is applied to the second n-type electrode NE2 and the p-type electrode PE, the second light emitting layer RE can emit light. More, in the first light emitting element LED1 and the second light emitting element LED2, when the voltage is applied to the first n-type electrode NE1, the second n-type electrode NE2 and the p-type electrode PE, the first light emitting layer GE, BE and the second light emitting layer RE can emit light.

The display device 700 can further include a reflective layer disposed so as to overlap the light emitting element. The reflective layer reflects light emitted from the light emitting element to the outside to improve the optical efficiency of the display device 700.

The first connecting unit CEr, the second connecting unit CEg, and the third connecting unit CEb can be disposed on the second insulating layer 713. At this time, the first connecting unit CEr, the second connecting unit CEg, and the third connecting unit CEb can electrically connect the driving transistors 720R, 720G, and 720B to the first and second light emitting elements LED1 and LED2 by means of the contact holes of the first insulating layer 712 and the second insulating layer 713. The first connecting unit CEr, the second connecting unit CEg, and the third connecting unit CEb can be formed of a transparent metal oxide such as indium tin oxide (ITO), indium gallium zinc oxide (IGZO), or indium gallium oxide (IGO), but is not limited thereto.

Figure 8A:
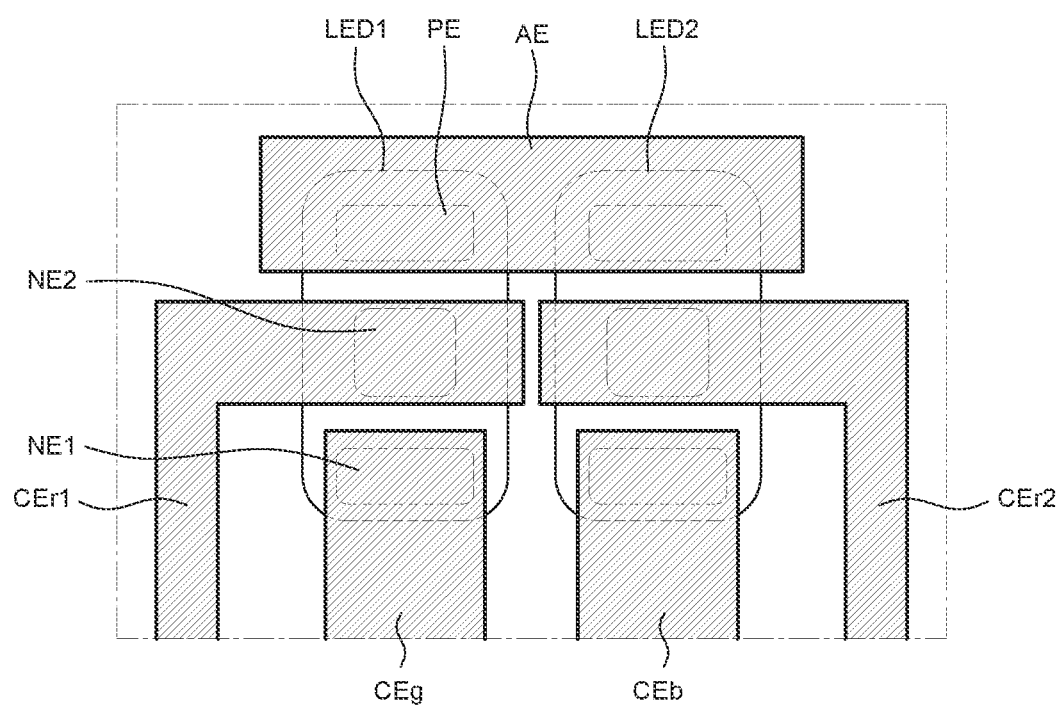
FIGS. 8A and 8B are views illustrating a display device according to another exemplary embodiment of the present disclosure.

FIG. 8A is another example illustrating a connection structure of the pixel PX in which two light emitting elements LED are disposed. The first light emitting element LED1 and the second light emitting element LED2 can be connected to the driving transistor by means of different connecting units CEr1 and CEr2. For example, the second n-type electrode NE2 of the first light emitting element LED1 can be connected to the driving transistor by a first sub connecting unit CEr1. Further, the second n-type electrode NE2 of the second light emitting element LED2 can be connected to the driving transistor by a second sub connecting unit CEr2. By doing this, the red light emitting layers of the first light emitting element LED1 and the second light emitting element LED2 can be individually controlled.

Further, the green light emitting layer GE of the first light emitting element LED1 and the blue light emitting layer BE of the second light emitting element LED2 can be connected to the driving transistor with the same structure of FIG. 6D.

Figure 8B:
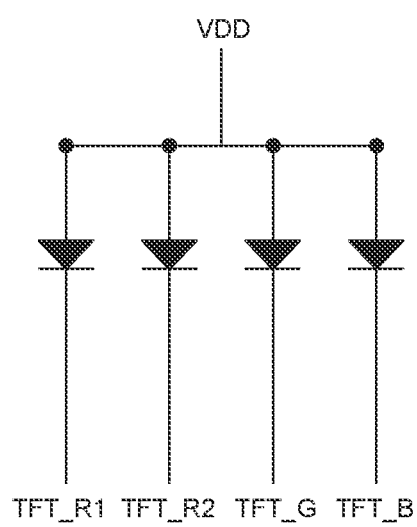

An equivalent circuit which schematically illustrates a connection structure as illustrated in FIG. 8A is illustrated in FIG. 8B. The first light emitting element LED1 and the second light emitting element LED2 each include two types of light emitting elements so that one pixel PX drives a total of four light emitting elements to emit light. Anodes of four light emitting elements are connected to the same power source VDD and cathodes of four light emitting elements are connected to the driving transistors TFT R, TFT_G, and TFT_B, respectively. At this time, the light emitting layers (for example, second light emitting layers) which are included in both the first light emitting element LED1 and the second light emitting element LED2 can be controlled by different driving transistors (for example, TFT_R1 and TFT_R2).

As described above, the display device according to the exemplary embodiment of the present disclosure can configure a pixel with the reduced number of light emitting elements as compared with the display device with the structure of the related art so that a space utilization can be increased and the aperture rate can be significantly improved when it is applied to a transparent display device.

Further, in the display device according to the embodiments of the present disclosure, the process of transferring the light emitting element LED can be reduced as compared with the display device with the structure of the related art so that a production cost can be saved. Further, in the display device according to the exemplary embodiment of the present disclosure, a space for a light source unit is reduced so that a black area can be ensured to be larger than that of the structure of the related art. Accordingly, the display device according to the exemplary embodiment of the present disclosure can further improve a contrast.

The exemplary embodiments of the present disclosure can also be described as follows:

According to an aspect of the present disclosure, there is provided a light emitting element. The light emitting element includes a first n-type semiconductor layer, a first light emitting layer disposed on the first n-type semiconductor layer, a first p-type semiconductor layer disposed on the first light emitting layer, a second p-type semiconductor layer disposed on the first p-type semiconductor layer, a bonding layer disposed between the first p-type semiconductor layer and the second p-type semiconductor layer, a second light emitting layer disposed on the second p-type semiconductor layer, a second n-type semiconductor layer disposed on the second light emitting layer, a p-type electrode disposed on the second p-type semiconductor layer, a first n-type electrode disposed on the first n-type semiconductor layer, and a second n-type electrode disposed on the second n-type semiconductor layer.

A part of the first n-type semiconductor layer can protrude outwardly from the first light emitting layer, the first p-type semiconductor layer, the second p-type semiconductor layer, the second light emitting layer, and the second n-type semiconductor layer. The first n-type electrode can be disposed on the part of the first n-type semiconductor layer which protrudes outwardly from the first light emitting layer and the second light emitting layer.

The entire second p-type semiconductor layer can overlap the first light emitting layer. A part of the second p-type semiconductor layer can protrude outwardly from the second light emitting layer and the second n-type semiconductor layer. The p-type electrode can be disposed on the part of the second p-type semiconductor layer which protrudes outwardly from the second light emitting layer.

A thickness of the first n-type electrode can be larger than a thickness of the second n-type electrode.

The first n-type electrode can be formed of an opaque conductive material. The second n-type electrode can be formed of a transparent conductive material.

The bonding layer can be formed of a conductive material having a high transmittance. The p-type electrode can be electrically connected to the first p-type semiconductor layer by means of the second p-type semiconductor layer and the bonding layer.

The bonding layer can be formed of a non-conductive material having a high transmittance. A part of the p-type electrode can pass through the second p-type semiconductor layer and the bonding layer to be in contact with the first p-type semiconductor layer.

The first light emitting layer can be one of a green light emitting layer and a blue light emitting layer. The second light emitting layer can be a red light emitting layer.

According to another aspect of the present disclosure, there is provided a display device. The display device includes a substrate having a display area in which a plurality of pixels is disposed and a non-display area in the vicinity of the display area, and a first light emitting element and a second light emitting element disposed in each of the plurality of pixels. Each of the first and second light emitting elements includes a first n-type semiconductor layer disposed on the substrate, a first light emitting layer disposed on the first n-type semiconductor layer, a p-type semiconductor layer disposed on the first light emitting layer, a second light emitting layer disposed on the p-type semiconductor layer, a second n-type semiconductor layer disposed on the second light emitting layer, a p-type electrode disposed on the p-type semiconductor layer, a first n-type electrode disposed on the first n-type semiconductor layer, and a second n-type electrode disposed on the second n-type semiconductor layer.

The p-type semiconductor layer can include a first p-type semiconductor layer disposed on the first light emitting layer, and a second p-type semiconductor layer disposed on the first p-type semiconductor layer.

The entire second p-type semiconductor layer, the entire first p-type semiconductor layer, and the entire first light emitting layer can overlap the first n-type semiconductor layer. The entire second n-type semiconductor layer and the entire second light emitting layer can overlap the second p-type semiconductor layer.

The first n-type electrode can be disposed on the first n-type semiconductor layer which does not overlap the first light emitting layer. The p-type electrode can be disposed on the second p-type semiconductor layer which does not overlap the second light emitting layer. In a plan view, the second n-type electrode can be disposed between the first n-type electrode and the p-type electrode.

The p-type electrode of the first light emitting element and the p-type electrode of the second light emitting element can be connected to the same common electrode.

The first n-type electrode of the first light emitting element can be connected to a transistor which controls emission of the first light emitting layer of the first light emitting element. The first n-type electrode of the second light emitting element can be connected to a transistor which controls emission of the first light emitting layer of the second light emitting element.

The second n-type electrode of the first light emitting element can be connected to a transistor which controls emission of the second light emitting layer of the first light emitting element. The second n-type electrode of the second light emitting element can be connected to a transistor which controls emission of the second light emitting layer of the second light emitting element.

The transistor which controls emission of the second light emitting layer of the first light emitting element and the transistor which controls emission of the second light emitting layer of the second light emitting element can be the same transistor.

When a voltage is applied to the first n-type electrode and the p-type electrode, the first light emitting layer can emit light. When a voltage is applied to the second n-type electrode and the p-type electrode, the second light emitting layer can emit light. When a voltage is applied to the first n-type electrode, the second n-type electrode and the p-type electrode, the first light emitting layer and the second light emitting layer can emit light.

The first light emitting element can emit green light from the first light emitting layer and emit red light from the second light emitting layer. The second light emitting element can emit blue light from the first light emitting layer and emit red light from the second light emitting layer.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate including a display area in which a plurality of pixels is disposed and a non-display area in a vicinity of the display area;
   a first light emitting element and a second light emitting element disposed in each of the plurality of pixels,
   wherein each of the first and second light emitting elements includes:
     a first n-type semiconductor layer disposed on the substrate;
     a first light emitting layer disposed on the first n-type semiconductor layer;
     a p-type semiconductor layer disposed on the first light emitting layer;
     a bonding layer disposed on the p-type semiconductor layer, wherein the bonding layer is light transmissive and includes a conductor;
     a second light emitting layer disposed on the bonding layer;
     a second n-type semiconductor layer disposed on the second light emitting layer;
     a p-type electrode disposed on the p-type semiconductor layer;
     a first n-type electrode disposed on the first n-type semiconductor layer; and
     a second n-type electrode disposed on the second n-type semiconductor layer;
   a common electrode connected to the p-type electrode of the first light emitting element and the p-type electrode of the second light emitting element;
   a first transistor connected to the first n-type electrode of the first light emitting element and controlling emission of the first light emitting layer of the first light emitting element;
   a second transistor connected to the first n-type electrode of the second light emitting element and controlling emission of the first light emitting layer of the second light emitting element, the second transistor being different from the first transistor; and
   a third transistor connected to the second n-type electrode of the first light emitting element and the second n-type electrode of the second light emitting element, the third transistor controlling emission of the second light emitting layer of the first light emitting element and emission of the second light emitting layer of the second light emitting element,
   wherein the first light emitting element emits green light from the first light emitting layer and emits red light from the second light emitting layer, and does not include a blue light emitting layer,
   wherein the second light emitting element emits blue light from the first light emitting layer and emits red light from the second light emitting layer, and does not include a green light emitting layer,
   wherein a size of the bonding layer is a same as a size of at least one of the green light emitting layer and the blue light emitting layer, and is greater than a size of the red light emitting layer,
   wherein the p-type semiconductor layer includes:
     a first p-type semiconductor layer disposed on the first light emitting layer; and
     a second p-type semiconductor layer disposed on the first p-type semiconductor layer,
   wherein the p-type electrode is electrically connected to both the first p-type semiconductor layer and the second p-type semiconductor layer,
   wherein the bonding layer is disposed between the first p-type semiconductor layer and the second p-type semiconductor layer, and
   wherein the p-type electrode is electrically connected to the first p-type semiconductor layer by using the second p-type semiconductor layer and the bonding layer.

2. The display device according to claim 1, wherein the entire second p-type semiconductor layer, the entire first p-type semiconductor layer, and the entire first light emitting layer overlap the first n-type semiconductor layer, and
   the entire second n-type semiconductor layer and the entire second light emitting layer overlap the second p-type semiconductor layer.

3. The display device according to claim 2, wherein the first n-type electrode is disposed on the first n-type semiconductor layer which does not overlap the first light emitting layer,
   the p-type electrode is disposed on the second p-type semiconductor layer which does not overlap the second light emitting layer, and
   in a plan view, the second n-type electrode is disposed between the first n-type electrode and the p-type electrode.

4. The display device according to claim 1, wherein when a first voltage is applied to the first n-type electrode and the p-type electrode, the first light emitting layer emits light,
   when a second voltage is applied to the second n-type electrode and the p-type electrode, the second light emitting layer emits light, and when a third voltage is applied to the first n-type electrode, the second n-type electrode and the p-type electrode, the first light emitting layer and the second light emitting layer emit light.

5. The display device according to claim 1, wherein the first light emitting layer that emits the green light in the first light emitting element and the first light emitting layer that emits the blue light in the second light emitting element are coplanar, and wherein the second light emitting layer that emits the red light in the first light emitting element and the second light emitting layer that emits the red light in the second light emitting element are coplanar.

6. The display device according to claim 1, further comprising an insulating layer that covers an entire side surface and a first part of a top surface of the first n-type semiconductor layer to expose a second part of the top surface of the first n-type semiconductor layer, and covers an entire side surface of the one or the other of the green light emitting layer and the blue light emitting layer.

7. The display device according to claim 6, wherein the insulating layer further covers an entire side surface of the first p-type semiconductor layer, an entire side surface of the bonding layer, an entire side surface and a part of a top surface of the second p-type semiconductor layer, an entire side surface of the second light emitting layer, and an entire side surface and a first part of a top surface of the second n-type semiconductor layer to expose a second part of the top surface of the second n-type semiconductor layer.

8. The display device according to claim 1, wherein the p-type electrode is in direct physical contact with the second p-type semiconductor layer and is not in direct physical contact with the first p-type semiconductor layer.

9. The display device according to claim 1, wherein the bonding layer includes an anisotropic conductive film (ACF).

* * * * *